US009596120B2

(12) United States Patent
Yamanouchi

(10) Patent No.: US 9,596,120 B2
(45) Date of Patent: Mar. 14, 2017

(54) SIGNAL TRANSMISSION APPARATUS, DISTORTION COMPENSATION APPARATUS, AND SIGNAL TRANSMISSION METHOD

(71) Applicant: NEC CORPORATION, Tokyo (JP)

(72) Inventor: Shingo Yamanouchi, Tokyo (JP)

(73) Assignee: NEC CORPORATION, Tokyo (JP)

(*) Notice: Subject to any disclaimer, the term of this patent is extended or adjusted under 35 U.S.C. 154(b) by 0 days.

(21) Appl. No.: 15/024,891

(22) PCT Filed: Aug. 26, 2014

(86) PCT No.: PCT/JP2014/072272
§ 371 (c)(1),
(2) Date: Mar. 25, 2016

(87) PCT Pub. No.: WO2015/045709
PCT Pub. Date: Apr. 2, 2015

(65) Prior Publication Data
US 2016/0226698 A1 Aug. 4, 2016

(30) Foreign Application Priority Data

Sep. 26, 2013 (JP) ................................. 2013-199395

(51) Int. Cl.
*H04K 1/02* (2006.01)
*H04L 25/03* (2006.01)
(Continued)

(52) U.S. Cl.
CPC ............. *H04L 27/367* (2013.01); *H03F 1/32* (2013.01); *H03F 1/3247* (2013.01); *H03F 3/19* (2013.01);
(Continued)

(58) Field of Classification Search
CPC ........ H03F 1/3247; H03F 3/24; H03F 1/3241; H04L 27/368; H03G 3/3042
(Continued)

(56) References Cited

U.S. PATENT DOCUMENTS 3,732,502 A * 5/1973 Seidel .................... H03F 1/3252
330/149
4,656,502 A * 4/1987 Hausdorfer ............. H04N 9/77
348/493
(Continued)

FOREIGN PATENT DOCUMENTS

EP  1 732 208 A1  12/2006
JP  3335907 A    10/2002
(Continued)

OTHER PUBLICATIONS

Nobuhiko Miki et al., "LTE-Advanced ni okeru koutaiikika wo jitsugen suru Carrier Aggregation (Carrier Aggregation achieving a wider bandwidth in LTE-Advanced)", NTT DOCOMO Technical Journal, vol. 18, No. 2.
(Continued)

*Primary Examiner* — James M Perez
(74) *Attorney, Agent, or Firm* — Sughrue Mion, PLLC

(57) ABSTRACT

A signal conversion unit (120) of a signal transmission apparatus (10) includes an in-band distortion compensation analog circuit unit (122) that generates, for each band, an in-band distortion compensation signal for compensating for in-band intermodulation distortion occurring due to frequency mixing of RF signals of a single band, the distortion being included in RF signals which are output from an amplification unit (130), and causes the generated signal to be carried by the RF signals corresponding to the single band, and an inter-band distortion compensation analog circuit unit (124) that generates, for each combination of two bands, an inter-band distortion compensation signal for
(Continued)

compensating for cross-modulation distortion occurring due to frequency mixing of RF signals between a plurality of bands which are input to the amplification unit (130), and causes the generated signal to be carried by each of the RF signals corresponding to the two bands.

9 Claims, 12 Drawing Sheets

(51) Int. Cl.
| | |
|---|---|
| H04L 25/49 | (2006.01) |
| H04L 27/36 | (2006.01) |
| H03F 3/24 | (2006.01) |
| H03F 1/32 | (2006.01) |
| H03F 3/19 | (2006.01) |
| H04B 1/04 | (2006.01) |

(52) U.S. Cl.
CPC ............. *H03F 3/24* (2013.01); *H04B 1/04* (2013.01); *H04B 1/0475* (2013.01); *H03F 2200/451* (2013.01); *H03F 2201/3215* (2013.01)

(58) Field of Classification Search
USPC ................................. 375/229–236, 295–315
See application file for complete search history.

(56) References Cited

U.S. PATENT DOCUMENTS

| | | | | | |
|---|---|---|---|---|---|
| 4,879,519 | A * | 11/1989 | Myer | ............ | H03F 1/3235 330/149 |
| 4,885,551 | A * | 12/1989 | Myer | ............ | H03F 1/3235 330/151 |
| 5,963,845 | A * | 10/1999 | Floury | ............ | H04B 7/18515 455/103 |
| 5,999,559 | A * | 12/1999 | Takaki | ............ | H04B 1/109 375/130 |
| 6,032,028 | A * | 2/2000 | Dickey | ............ | H03C 3/40 332/117 |
| 6,072,998 | A * | 6/2000 | Kaku | ............ | H03G 3/3052 375/345 |
| 6,429,738 | B1 * | 8/2002 | Kenington | ............ | H03F 1/3235 330/151 |
| 6,437,644 | B1 * | 8/2002 | Kenington | ............ | H03F 1/3247 330/136 |
| 6,549,067 | B1 * | 4/2003 | Kenington | ............ | H03F 1/3247 330/149 |
| 6,697,633 | B1 * | 2/2004 | Dogan | ............ | G01S 3/74 455/450 |
| 7,289,575 | B1 * | 10/2007 | Kenington | ............ | H03F 1/3241 330/144 |
| 7,577,085 | B1 * | 8/2009 | Narasimhan | ............ | H04L 1/0606 370/206 |
| 8,767,869 | B2 * | 7/2014 | Rimini | ............ | H04B 1/109 370/334 |
| 8,798,117 | B1 * | 8/2014 | Campbell | ............ | H04B 7/0814 375/148 |
| 8,948,301 | B2 * | 2/2015 | Rollins | ............ | H04L 27/368 375/285 |
| 8,948,325 | B1 * | 2/2015 | Warner | ............ | H04B 1/0475 375/297 |
| 9,246,719 | B2 * | 1/2016 | Pullela | ............ | H03D 7/165 |
| 9,401,826 | B2 * | 7/2016 | Eitel | ............ | H04L 25/0238 |
| 2002/0075907 | A1 * | 6/2002 | Cangiani | ............ | H04L 5/04 370/535 |
| 2002/0127986 | A1 * | 9/2002 | White | ............ | H04B 1/123 455/194.2 |
| 2002/0146996 | A1 * | 10/2002 | Bachman, II | ............ | H03F 1/3229 455/302 |
| 2003/0072385 | A1 * | 4/2003 | Dragonetti | ............ | H04L 5/04 375/295 |
| 2005/0190867 | A1 * | 9/2005 | Sobchak | ............ | H04B 1/1036 375/346 |
| 2005/0226353 | A1 * | 10/2005 | Gebara | ............ | H01Q 1/521 375/346 |
| 2006/0080065 | A1 * | 4/2006 | Pupalaikis | ............ | G01R 13/0272 702/189 |
| 2006/0276147 | A1 * | 12/2006 | Suzuki | ............ | H03F 1/3258 455/114.3 |
| 2007/0171994 | A1 * | 7/2007 | Parker | ............ | H04L 1/08 375/260 |
| 2007/0207759 | A1 * | 9/2007 | Vavelidis | ............ | H04B 17/21 455/232.1 |
| 2008/0009258 | A1 * | 1/2008 | Safarian | ............ | H04B 1/525 455/307 |
| 2008/0019433 | A1 * | 1/2008 | Yamanouchi | ............ | H03F 1/3241 375/224 |
| 2008/0039045 | A1 * | 2/2008 | Filipovic | ............ | H04B 1/109 455/295 |
| 2009/0036082 | A1 * | 2/2009 | Sajid | ............ | H04B 1/525 455/296 |
| 2009/0068974 | A1 * | 3/2009 | Smith | ............ | H04B 1/30 455/304 |
| 2009/0072901 | A1 * | 3/2009 | Yamanouchi | ............ | H03F 1/3223 330/149 |
| 2009/0232191 | A1 * | 9/2009 | Gupta | ............ | H04L 27/2096 375/216 |
| 2010/0309774 | A1 * | 12/2010 | Astrom | ............ | H04B 1/525 370/201 |
| 2010/0316157 | A1 * | 12/2010 | Bassam | ............ | H04L 25/03343 375/267 |
| 2010/0330947 | A1 * | 12/2010 | Khoury | ............ | H04B 1/28 455/302 |
| 2012/0069931 | A1 * | 3/2012 | Gandhi | ............ | H03F 1/3247 375/296 |
| 2013/0076437 | A1 * | 3/2013 | Smiley | ............ | H03F 1/3247 330/149 |
| 2013/0183921 | A1 * | 7/2013 | Mu | ............ | H03D 7/166 455/326 |
| 2014/0219195 | A1 * | 8/2014 | Calvanese Strinati | ............ | H04J 11/0026 370/329 |
| 2014/0348263 | A1 * | 11/2014 | Rollins | ............ | H04L 27/368 375/297 |
| 2014/0348266 | A1 * | 11/2014 | Yamanouchi | ............ | H04L 27/2621 375/297 |
| 2015/0049841 | A1 * | 2/2015 | Laporte | ............ | H03F 1/3247 375/297 |
| 2015/0111511 | A1 * | 4/2015 | Yamanouchi | ............ | H03F 1/0277 455/127.2 |
| 2015/0207464 | A1 * | 7/2015 | Yamanouchi | ............ | H03F 1/0277 375/297 |
| 2015/0318880 | A1 * | 11/2015 | Rexberg | ............ | H03F 1/3247 375/297 |
| 2016/0013820 | A1 * | 1/2016 | Yamanouchi | ............ | H04B 1/0475 375/297 |
| 2016/0079933 | A1 * | 3/2016 | Fehri | ............ | H03F 1/3247 330/75 |

FOREIGN PATENT DOCUMENTS

| | | |
|---|---|---|
| JP | 2005-244937 A | 9/2005 |
| JP | 2005-253045 A | 9/2005 |
| JP | 3951521 B2 | 8/2007 |
| JP | 4319681 B2 | 8/2009 |
| JP | 2012-142840 A | 7/2012 |
| JP | 2012-227881 A | 11/2012 |
| WO | 2007/123040 A1 | 11/2007 |
| WO | 2013/042031 A1 | 3/2013 |

OTHER PUBLICATIONS

Shigeru Ando, "Denshi Kairo Kiso kara Shisutemu made (Electronic circuit: from basis to its system)", Aifukan.

Shingo Yamanouchi et al., "Analysis of Design of a Dynamic Predistorter for WCDMA Handset Power Amplifiers", IEEE Trans-

(56) References Cited

OTHER PUBLICATIONS actions on Microwave Theory and Techniques, Mar. 2007, pp. 493-503, vol. 55, No. 3.
International Search Report for PCT/JP2014/072272 dated Nov. 4, 2014.

* cited by examiner

SIGNAL TRANSMISSION APPARATUS, DISTORTION COMPENSATION APPARATUS, AND SIGNAL TRANSMISSION METHOD

CROSS REFERENCE TO RELATED APPLICATIONS

This application is a National Stage of International Application No. PCT/JP2014/072272filed Aug. 26, 2014, claiming priority based on Japanese Patent Application No. 2013-199295filed Sep. 26, 2013, the contents of all which are incorporated herein by reference in their entirety.

TECHNICAL FIELD

The present invention relates to a signal transmission apparatus that transmits radio frequency (RF) signals of a plurality of bands, a distortion compensation apparatus, and a signal transmission method.

BACKGROUND ART

Nonlinearity of a power amplifier (PA) in a radio transmission apparatus that amplifies an RF signal used in radio communication is a factor seriously distorting the RF signal. This distortion of the RF signal causes generation of power leakage to the outside of a desired band used in transmission. Therefore, suppressing the distortion of the RF signal to be transmitted becomes an important technical issue in the transmission apparatus.

In recent years, in order to achieve higher-speed radio communication, a carrier aggregation (CA) technique for collectively using a plurality of fragmented bands disclosed in, for example, Non-Patent Document 1 has been used in some cases. In this CA technique, it is possible to secure a broadband by bringing a plurality of bands together, and to increase a transmission rate.

In addition, in an inter-band non-contiguous CA mode in which respective carrier frequencies are largely separated from each other (difference $\Delta f$ between respective carrier frequencies is sufficiently larger than the modulation bandwidth $f_{BB}$ of an RF signal of each carrier), it is possible to improve the stability of communication by simultaneously performing communication at a plurality of carrier frequencies having different propagation characteristics.

A communication system using such a CA technique requires a signal transmission apparatus that transmits RF signals of a plurality of bands. A function of suppressing the above-mentioned distortion of the RF signal is required in such a signal transmission apparatus. In addition, from the viewpoint of a reduction in the size and cost of the apparatus, it is preferable that the transmission apparatus compatible with the CA technique can amplify and transmit RF signals of a plurality of bands using a single power amplifier.

The following Patent Documents 1 to 4 disclose a distortion compensation circuit that calculates and outputs a signal for canceling out the nonlinearity of a power amplifier that collectively amplifies RF signals of a plurality of bands, in a digital arithmetic circuit, to thereby suppress signal distortion of the RF signals which are output from the amplifier. In addition, Patent Documents 3 and 4 disclose an analog circuit having a function of compensating for in-band intermodulation distortion occurring due to frequency mixing within a single band using a look-up table or a power series. In addition, Patent Document 5 also discloses an analog circuit (radio frequency pre-distortion (RF-PD)) that calculates and outputs a signal for canceling out in-band intermodulation distortion occurring by mixing RF signals of a single band in a power amplifier. In Patent Document 5, a plurality of RF-PDs corresponding to respective frequencies are provided, and a method is disclosed in which an RF signal of a frequency corresponding to each RF-PD is selected by a switch and is input to the RF-PD, to thereby compensate for in-band intermodulation distortion occurring due to frequency mixing within a single band. The RF-PD disclosed in Patent Document 5 can be implemented using, for example, a diode linearizer disclosed in Patent Documents 6 to 8. In addition, the RF-PD disclosed in Patent Document 5 can also be implemented using an intermodulation distortion generation circuit disclosed in Patent Document 9.

RELATED DOCUMENTS

Patent Documents

[Patent Document 1] Specification of U.S. Patent Application Publication No. 2010/0316157
[Patent Document 2] Japanese Unexamined Patent Publication No. 2012-227811
[Patent Document 3] Japanese Unexamined Patent Publication No. 2005-244937
[Patent Document 4] Japanese Unexamined Patent Publication No. 2005-253045
[Patent Document 5] Japanese Unexamined Patent Publication No. 2012-142840
[Patent Document 6] Japanese Patent No. 3335907
[Patent Document 7] Japanese Patent No. 3951521
[Patent Document 8] Japanese Patent No. 4319681
[Patent Document 9] International Publication No. WO2007/123040

Non-Patent Documents

[Non-Patent Document 1] Nobuhiko Miki and others, "CA for Bandwidth Extension in LTE-Advanced", NTT DoCoMo Technical Journal, Vol. 18, No. 2
[Non-Patent Document 2] Shigeru Ando, "Denshi-Kairo Kiso kara Shisutemu made", Published by BAIFUKAN CO., LTD.
[Non-Patent Document 3] S. Yamanouchi et al., "Analysis of Design of a Dynamic Predistorter for WCDMA Handset Power Amplifiers", IEEE Transactions on Microwave Theory and Techniques, Vol. 55, No. 3, pp. 493-503

SUMMARY OF THE INVENTION

The digital arithmetic circuit of Patent Document 1 can simultaneously compensate for in-band intermodulation distortion and cross-modulation distortion. However, the digital arithmetic circuit has a problem in that the modulation bandwidth of a transmission signal is restricted due to the operation speed of a central processing unit (CPU) or the operation speed of a digital-analog converter. The restriction of the modulation bandwidth of a transmission signal leads to the restriction of communication speed. In order to solve such a problem, it is preferable to perform implementation using the analog circuit rather than the digital arithmetic circuit.

However, the analog circuit generally does not have flexible program functions. For this reason, it is difficult to implement distortion compensation functions (functions of compensating for in-band intermodulation distortion and compensating for cross-modulation distortion simultaneously) of the above-mentioned digital arithmetic circuit onto one analog circuit. Actually, the analog circuit disclosed in Patent Document 3 and the like compensates for only the in-band intermodulation distortion, and does not compensate for the cross-modulation distortion.

An object of the present invention is to provide a signal transmission apparatus that compensates for both in-band intermodulation distortion and cross-modulation distortion occurring when signals of a plurality of bands are amplified by a single power amplifier, using an analog circuit.

According to the present invention, it is possible to compensate for in-band intermodulation distortion and cross-modulation distortion occurring when RF signals of a plurality of bands are collectively amplified by an amplifier, using an analog circuit.

According to the present invention, there is provided a signal transmission apparatus including: a signal generation unit that outputs a plurality of analog baseband signals corresponding to each band; a signal conversion unit that converts the plurality of output analog baseband signals into radio frequency (RF) signals of corresponding bands; and an amplification unit that collectively amplifies the RF signals converted for each band, wherein the signal conversion unit includes an in-band distortion compensation analog circuit unit that generates, for each band, an in-band distortion compensation signal for compensating for in-band intermodulation distortion occurring due to frequency mixing of RF signals of a single band, the distortion being included in the RF signals which are output from the amplification unit, and causes the generated signal to be carried by the RF signals corresponding to the single band, and an inter-band distortion compensation analog circuit unit that generates, for each combination of two bands, an inter-band distortion compensation signal for compensating for cross-modulation distortion occurring due to frequency mixing of RF signals between a plurality of bands which are input to the amplification unit, and causes the generated signal to be carried by each of the RF signals corresponding to the two bands.

According to the present invention, there is provided a distortion compensation apparatus that compensates for in-band intermodulation distortion for each band and cross-modulation distortion between a plurality of bands, included in RF signals which are output from an amplification unit that collectively amplifies radio frequency (RF) signals of a plurality of bands, the apparatus including: an in-band distortion compensation analog circuit unit that generates, for each band, an in-band distortion compensation signal for compensating for in-band intermodulation distortion occurring due to frequency mixing of RF signals of a single band, the distortion being included in the RF signals which are output from the amplification unit, and causes the generated signal to be carried by the RF signals corresponding to the single band; and an inter-band distortion compensation analog circuit unit that generates, for each combination of two bands, an inter-band distortion compensation signal for compensating for cross-modulation distortion occurring due to frequency mixing of RF signals between a plurality of bands which are input to the amplification unit, and causes the generated signal to be carried by each of the RF signals corresponding to the two bands.

According to the present invention, there is provided a signal transmission method performed by a signal transmission apparatus including an amplification unit that collectively amplifies radio frequency (RF) signals of a plurality of bands, the method including: outputting a plurality of analog baseband signals corresponding to each band in a signal generation unit; converting the plurality of output analog baseband signals into radio frequency (RF) signals of corresponding bands in a signal conversion unit; generating, for each band, an in-band distortion compensation signal for compensating for in-band intermodulation distortion occurring due to frequency mixing of RF signals of a single band, the distortion being included in the RF signals which are output from the amplification unit, and causing the generated signal to be carried by the RF signals corresponding to the single band, in an in-band distortion compensation analog circuit unit; generating, for each combination of two bands, an inter-band distortion compensation signal for compensating for cross-modulation distortion occurring due to frequency mixing of RF signals between a plurality of bands which are input to the amplification unit, and causing the generated signal to be carried by each of the RF signals corresponding to the two bands, in an inter-band distortion compensation analog circuit unit; and collectively amplifying and transmitting RF signals of a plurality of bands including the in-band distortion compensation signal and the inter-band distortion compensation signal, in the amplification unit.

BRIEF DESCRIPTION OF THE DRAWINGS

The above-mentioned objects, other objects, features and advantages will be made clearer from the preferred exemplary embodiments described below, and the following accompanying drawings.

DESCRIPTION OF EXEMPLARY EMBODIMENTS

Figure 1:
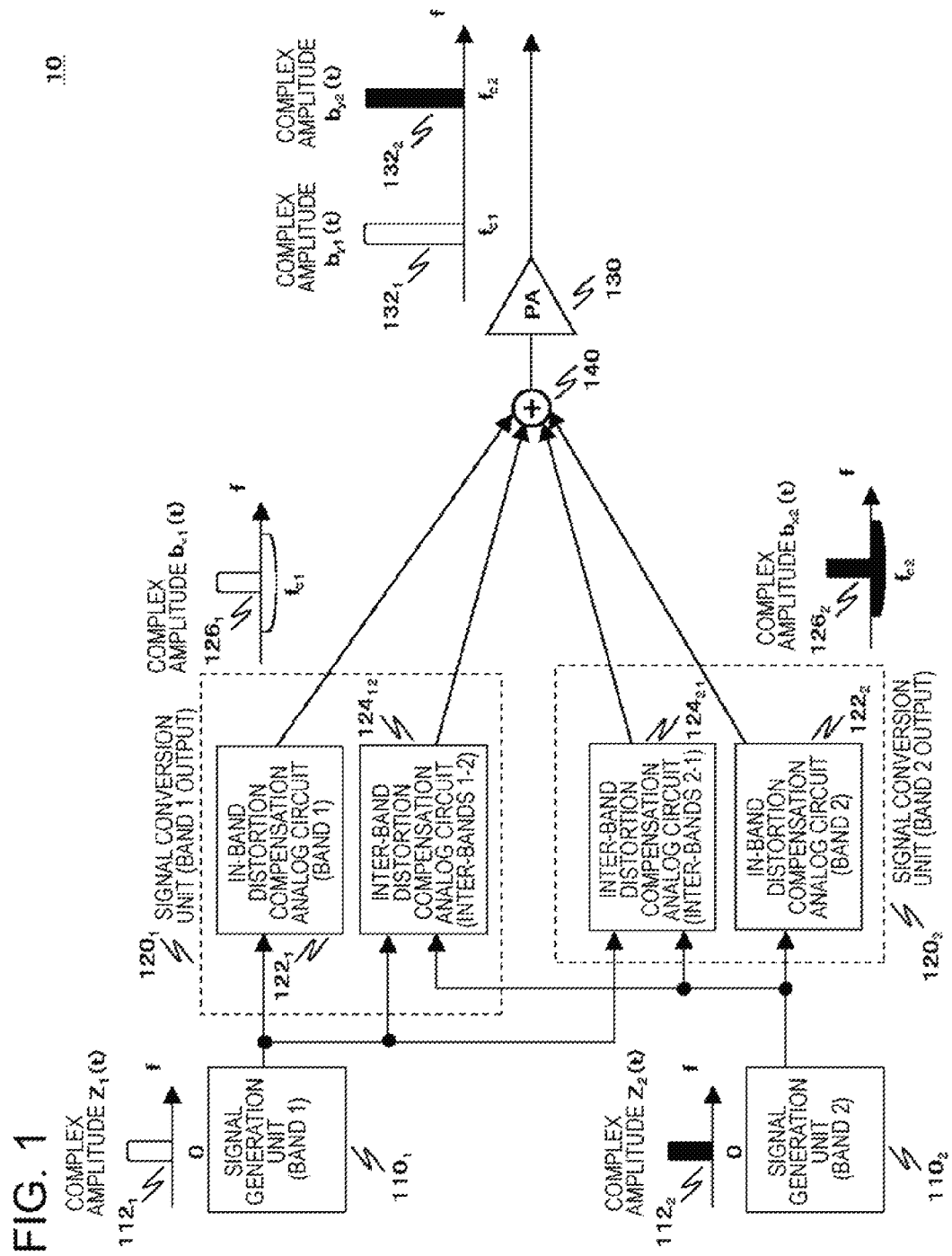
FIG. 1 is a block diagram illustrating a process configuration example of a signal transmission apparatus in a first exemplary embodiment of the present invention.

Hereinafter, exemplary embodiments of the present invention will be described with reference to the accompanying drawings. In all the drawings, like elements are referenced by like reference numerals and descriptions thereof will not be repeated.

(First Exemplary Embodiment)

FIG. 1 is a block diagram illustrating a process configuration example of a signal transmission apparatus 10 in a first exemplary embodiment of the present invention. In FIG. 1, in order to simplify the description, an example is shown in which RF signals of 2 bands are simultaneously transmitted. Meanwhile, in the following description, when respective processing units included in the signal transmission apparatus 10 are required to be discriminated from each other for each band, a suffix indicating each band is given to the reference numerals and signs of the respective processing units.

The signal transmission apparatus 10 includes a signal generation unit 110, a signal conversion unit 120, and an amplification unit 130, and RF signals of a plurality of bands are simultaneously transmitted.

The signal generation unit 110 outputs a plurality of analog baseband signals corresponding to each band. In the example of FIG. 1, a signal generation unit $110_1$ outputs an analog baseband signal which is carried by an RF signal of a first band (band 1: carrier frequency $f_{c1}$), and a signal generation unit $110_2$ outputs an analog baseband signal which is carried by an RF signal of a second band (band 2: carrier frequency $f_{c2}$).

The signal conversion unit 120 converts the plurality of analog baseband signals which are output from the signal generation unit 110 into RF signals of bands corresponding to each of the plurality of analog baseband signals. In addition, the signal conversion unit 120 includes an in-band distortion compensation analog circuit 122 and an inter-band distortion compensation analog circuit 124 that compensate for signal distortion occurring in the amplification unit 130.

The in-band distortion compensation analog circuit 122 generates an in-band distortion compensation signal. This "in-band distortion compensation signal" is a signal for compensating for in-band intermodulation distortion occurring due to frequency mixing of RF signals of a single band included in an RF signal which is output from the amplification unit 130. The in-band distortion compensation analog circuit 122 generates an in-band distortion compensation signal for each band, and causes the generated signal to be carried by an RF signal corresponding to each band. In the example of FIG. 1, an in-band distortion compensation analog circuit $122_1$ generates an in-band distortion compensation signal for compensating for in-band intermodulation distortion occurring due to frequency mixing within the band 1, and causes the generated signal to be carried by an RF signal of the band 1 which is output from a signal conversion unit $120_1$. In addition, an in-band distortion compensation analog circuit $122_2$ generates an in-band distortion compensation signal for compensating for in-band intermodulation distortion occurring due to frequency mixing within the band 2, and causes the generated signal to be carried by an RF signal of the band 2 which is output from a signal conversion unit $120_2$.

The inter-band distortion compensation analog circuit 124 generates an inter-band distortion compensation signal. This "inter-band distortion compensation signal" is a signal for compensating for cross-modulation distortion occurring due to frequency mixing of RF signals of a plurality of bands which are input to the amplification unit 130, and is generated for each combination of two bands. The inter-band distortion compensation analog circuit 124 causes the inter-band distortion compensation signal generated for each combination of two bands to be carried by each RF signal corresponding to the two bands. In the example of FIG. 1, an inter-band distortion compensation analog circuit $124_1$ generates an inter-band distortion compensation signal for compensating for cross-modulation distortion occurring due to frequency mixing between the band 1 and the band 2, and causes the generated signal to be carried by the RF signal of the band 1. In addition, an inter-band distortion compensation analog circuit $124_2$ generates an inter-band distortion compensation signal for compensating for cross-modulation distortion occurring due to frequency mixing between the band 2 and the band 1, and causes the generated signal to be carried by the RF signal of the band 2.

Hereinafter, the signal transmission apparatus 10 of the present exemplary embodiment will be described in more detail.

The signal generation unit $110_1$ outputs an analog baseband signal $112_1$ (complex amplitude $z_1(t)$) which is carried by the RF signal of the band 1. Similarly, the signal generation unit $110_2$ outputs an analog baseband signal $112_2$ (complex amplitude $z_2(t)$) which is carried by the RF signal of the band 2. The analog baseband signal $112_1$ is input to the signal conversion unit $120_1$, and the analog baseband signal $112_2$ is input to the signal conversion unit $120_2$.

The signal conversion unit $120_1$ outputs an RF signal $126_1$, obtained by carrying a complex amplitude $b_{x1}(t)$ for compensating for the nonlinearity of the amplification unit 130 by the carrier frequency $f_{c1}$ of the band 1, toward a synthesizer 140. Similarly, the signal conversion unit $120_2$ outputs an RF signal $126_2$, obtained by carrying a complex amplitude $b_{x2}(t)$ for compensating for the nonlinearity of the amplification unit 130 by the carrier frequency $f_{c2}$ of the band 2, toward the synthesizer 140.

The synthesizer 140 synthesizes the RF signal $126_1$ and RF signal $126_2$, and outputs the result toward the amplification unit 130.

The amplification unit 130 amplifies the input RF signal $126_1$ and the RF signal $126_2$, and outputs the result as an RF signal $132_1$ (complex amplitude $b_{y1}(t)$) and an RF signal $132_2$ (complex amplitude $b_{y2}(t)$) of a plurality of bands. The RF signal $132_1$ and the RF signal $132_2$ which are output are transmitted through an antenna (not shown).

Here, a relationship between the nonlinearity of the amplification unit 130 and the nonlinearity of the signal conversion unit 120 will be described.

The RF signal of the band 1 and the RF signal of the band 2 which are input to the amplification unit 130 are set to $x_1(t)$ and $x_1(t)$, respectively. In addition, the complex amplitudes (baseband signals carried by the RF signals) of the RF signals $x_1(t)$ and $x_2(t)$ are set to $b_{x1}(t)$ and $b_{x2}(t)$, respectively. In addition, the RF signal of the band 1 and the RF signal of the band 2 are set to $y_1(t)$ and $y_2(t)$, respectively. The complex amplitudes of RF signals $y_1(t)$ and $y_2(t)$ are set to $b_{y1}(t)$ and $b_{y2}(t)$, respectively.

When the amplification unit 130 simultaneously amplifies the signals of two bands, a relationship between the input and output signals of the amplification unit 130 is expressed as the following Expression (1).

$$b_{y1}(t) = g_1[b_{x1}(t), b_{x2}(t)]$$

$$b_{y2}(t) = g_2[b_{x1}(t), b_{x2}(t)] \quad \text{[Expression 1]}$$

Here, $g_1$ and $g_2$ are functions indicating the nonlinearity of the amplification unit 130. As expressed by Expression (1), the output signal of each band is dependent on not only the input signals of the same band, but also the input signals of different bands due to cross-modulation distortion occurring in the vicinity of a desired band caused by frequency mixing between a plurality of bands. In addition, the nonlinearity of the output signal of each band with respect to the input signal of the same band causes in-band intermodulation distortion occurring due to frequency mixing within a single band.

In addition, Expression (1) can be collectively denoted as in the following Expression (2).

$$[b_{y1}(t), b_{y2}(t)] = g[b_{x1}(t), b_{x2}(t)] \quad \text{[Expression 2]}$$

Here, g is a mapping for converting a vector $[b_{x1}(t), b_{x2}(t)]$ into $[b_{y1}(t), b_{y2}(t)]$, and indicates the nonlinearity of the amplification unit 130.

As described above, when the RF signals of a plurality of bands are input to the amplification unit 130, the cross-modulation distortion and the in-band intermodulation distortion occur due to the nonlinearity of the amplification unit 130. For this reason, the signal conversion unit 120 requires a function of canceling out the distortion occurring in the amplification unit 130.

The analog baseband signals of the band 1 and the band 2 which are input to the signal conversion unit 120 are set to $z_1(t)$ and $z_2(t)$, respectively. These analog baseband signals $[z_1(t), z_2(t)]$ are converted into the complex amplitudes $[b_{x1}(t), b_{x2}(t)]$ of the RF signals in the signal conversion unit 120, and are input to the amplification unit 130. The above conversion is denoted as in the following Expression (3).

$$[b_{x1}(t), b_{x2}(t)] = h[z_1(t), z_2(t)] \quad \text{[Expression 3]}$$

Here, h is a mapping for converting a vector $[z_1(t), z_2(t)]$ into $[b_{x1}(t), b_{x2}(t)]$, and indicates the nonlinearity of the signal conversion unit 120.

The nonlinearity h of the signal conversion unit 120 is set so as to cancel out the nonlinearity g of the amplification unit 130. That is, the nonlinearity h of the signal conversion unit 120 may be set to an inverse mapping of the nonlinearity g of the amplification unit 130. In the example of FIG. 1, the combined nonlinearity of the signal conversion unit 120₁ and the signal conversion unit 120₂ may be set to an inverse mapping of the nonlinearity of the amplification unit 130.

Here, the characteristics of the amplification unit 130 expressed in Expression (1) are developed up to a third-order term as in the following Expression (4).

$$b_{y1}(t) = g_1[b_{x1}(t), b_{x2}(t)] = k_{(1)}b_{x1}(t) + l_{(1)3}|b_{x1}(t)|^2 b_{x1}(t) + m_{(1)3}|b_{x2}(t)|^2 b_{x1}(t) + \ldots$$

$$b_{y2}(t) = g_2[b_{x1}(t), b_{x2}(t)] = k_{(2)}b_{x2}(t) + l_{(2)3}|b_{x2}(t)|^2 b_{x2}(t) + m_{(2)3}|b_{x1}(t)|^2 b_{x2}(t) + \ldots \quad \text{[Expression 4]}$$

In Expression (4), $k_{(1)}$ and $k_{(2)}$ are complex coefficients indicating the linear gain of the amplification unit 130. In addition, $l_{(1)3}$ and $l_{(2)3}$ are complex coefficients indicating third-order nonlinear distortion occurring due to frequency mixing within a single band in the amplification unit 130. In addition, $m_{(1)3}$ and $m_{(2)3}$ are complex coefficients indicating third-order nonlinear distortion occurring due to frequency mixing between a plurality of bands in the amplification unit 130.

Next, the characteristics of the signal conversion unit 120 which are represented by Expression (3) are developed up to a third-order term as in the following Expression (5).

$$b_{x1}(t) = h_1[z_1(t), z_2(t)] = p_{(1)}z_1(t) + q_{(1)3}|z_1(t)|^2 z_1(t) + r_{(1)3}|z_2(t)|^2 z_1(t) + \ldots$$

$$b_{x2}(t) = h_2[z_1(t), z_2(t)] = p_{(2)}z_2(t) + q_{(2)3}|z_2(t)|^2 z_2(t) + r_{(2)3}|z_1(t)|^2 z_2(t) + \ldots \quad \text{[Expression 5]}$$

In Expression (5), $p_{(1)}$ is a complex coefficient indicating the linear gain of the signal conversion unit 120₁, and $p_{(2)}$ is a complex coefficient indicating the linear gain of the signal conversion unit 120₂. In addition, $q_{(1)3}$ is a complex coefficient indicating third-order nonlinear distortion occurring due to frequency mixing within a single band in the signal conversion unit 120₁, and $q_{(2)3}$ is a complex coefficient indicating third-order nonlinear distortion occurring due to frequency mixing within a single band in the signal conversion unit 120₂. In addition, $r_{(1)3}$ is a complex coefficient indicating third-order nonlinear distortion occurring due to frequency mixing between a plurality of bands in the signal conversion unit 120₁, and $r_{(2)3}$ is a complex coefficient indicating third-order nonlinear distortion occurring due to frequency mixing between a plurality of bands in the signal conversion unit 120₂.

By substituting Expression (5) into Expression (4) and rearranging, the characteristics of the entire signal transmission apparatus 10 ranging from the signal generation unit 110₁ and the signal generation unit 110₂ to the output of the amplification unit 130 are obtained as in Expression (6).

$$b_{y1}(t) = u_{(1)}z_1(t) + v_{(1)3}|z_1(t)|^2 z_1(t) + w_{(1)3}|z_2(t)|^2 z_1(t) + \ldots$$

$$b_{y2}(t) = u_{(2)}z_2(t) + v_{(2)3}|z_2(t)|^2 z_2(t) + w_{(2)3}|z_1(t)|^2 z_2(t) + \ldots$$

$$u_{(1)} = k_{(1)}p_{(1)} \quad u_{(2)} = k_{(2)}p_{(2)}$$

$$v_{(1)3} = k_{(1)}p_{(1)3} + l_{(1)3}|p_{(1)}|^2 p_{(1)} \quad v_{(2)3} = k_{(2)}p_{(2)3} + l_{(2)3}|p_{(2)}|^2 p_{(2)}$$

$$w_{(1)3} = k_{(1)}r_{(1)3} + m_{(1)3}|p_{(2)}|^2 p_{(1)} \quad w_{(2)3} = k_{(2)}r_{(2)3} + m_{(2)3}|p_{(1)}|^2 p_{(2)} \quad \text{[Expression 6]}$$

In Expression (6), when all the coefficients ($v_{(1)3}$, $v_{(2)3}$, $w_{(1)3}$, $w_{(2)3}$) of items indicating nonlinearity are 0, the signal transmission apparatus 10 of FIG. 1 can transmit an RF signal which is not accompanied by signal distortion. Conditions in which all the coefficients ($v_{(1)3}$, $v_{(2)3}$, $w_{(1)3}$, $w_{(2)3}$) of items indicating nonlinearity are set to 0 are represented as in the following Expression (7).

$$v_{(1)3} = k_{(1)}p_{(1)3} + l_{(1)3}|p_{(1)}|^2 p_{(1)} = 0 \quad v_{(2)3} = k_{(2)}p_{(2)3} + l_{(2)3}|p_{(2)}|^2 p_{(2)} = 0$$

$$w_{(1)3} = k_{(1)}r_{(1)3} + m_{(1)3}|p_{(2)}|^2 p_{(1)} = 0 \quad w_{(2)3} = k_{(2)}r_{(2)3} + m_{(2)3}|p_{(1)}|^2 p_{(2)} = 0 \quad \text{[Expression 7]}$$

The coefficients ($q_{(1)3}$, $q_{(2)3}$, $r_{(1)3}$, $r_{(2)3}$) indicating the nonlinearities of the signal conversion unit 120₁ and the signal conversion unit 120₂ may be set so as to satisfy Expression (7). Optimum values ($q_{opt(1)3}$, $q_{opt(2)3}$, $r_{opt(1)3}$, $r_{opt(2)3}$) of the coefficients ($q_{(1)3}$, $q_{(2)3}$, $r_{(1)3}$, $r_{(2)3}$) indicating the nonlinearities of the signal conversion unit 120₁ and the signal conversion unit 120₂ are obtained as in Expression (8), based on Expression (7).

[Expression 8]

$$q_{opt(1)3} = \frac{-|p_{(1)}|^2 p_{(1)} l_{(1)3}}{k_{(1)}} \quad q_{opt(2)3} = \frac{-|p_{(2)}|^2 p_{(2)} l_{(2)3}}{k_{(2)}}$$

$$r_{opt(1)3} = \frac{-|p_{(2)}|^2 p_{(1)} m_{(1)3}}{k_{(1)}} \quad r_{opt(2)3} = \frac{-|p_{(1)}|^2 p_{(2)} m_{(2)3}}{k_{(2)}}$$

As shown in Expression (8), the characteristic coefficients ($q_{opt(1)3}$, $q_{opt(2)3}$, $r_{opt(1)3}$, $r_{opt(2)3}$) to be satisfied by the signal conversion unit 120₁ and the signal conversion unit 120₂ are determined by the coefficients ($k_{(1)}$, $k_{(2)}$, $l_{(1)3}$, $l_{(2)3}$, $m_{(1)3}$, $m_{(2)3}$) indicating the characteristics of the amplification unit 130. Therefore, the characteristics ($k_{(1)}$, $k_{(2)}$, $l_{(1)3}$, $l_{(2)3}$, $m_{(1)3}$, $m_{(2)3}$) of the amplification unit 130 may be measured offline in advance, and the characteristic coefficients ($q_{(1)3}$, $q_{(2)3}$, $r_{(1)3}$, $r_{(2)3}$) of the signal conversion unit $120_1$ and the signal conversion unit $120_2$ may be set based on the measurement results and Expression (8).

Meanwhile, as shown in Expression (8), the characteristic coefficients ($q_{opt(1)3}$, $q_{opt(2)3}$, $r_{opt(1)3}$, $r_{opt(2)3}$) to be satisfied by the signal conversion unit $120_1$ and the signal conversion unit $120_2$ are also dependent on the linear gains $p_{(1)}$ and $p_{(2)}$ of the signal conversion unit $120_1$ and the signal conversion unit $120_2$. The linear gains $p_{(1)}$ and $p_{(2)}$ of the signal conversion unit $120_1$ and signal conversion unit $120_2$ may be set to any value.

As shown in the discussion so far, the signal conversion unit $120_1$ and the signal conversion unit $120_2$ are required to output signal distortions ($|z_1(t)|^2 z_1(t)$ and $|z_2(t)|^2 z_2(t)$) occurring due to frequency mixing within a single band and signal distortions ($|z_2(t)|^2 z_1(t)$ and $|z_1(t)|^2 z_2(t)$) occurring due to frequency mixing between a plurality of bands, with predetermined amplitudes and phases represented by the complex coefficients of Expression (8). It is difficult to achieve the above desired functions through a single analog circuit. In the present application, as shown in each drawing, the in-band distortion compensation analog circuit $122_1$ and the in-band distortion compensation analog circuit $122_2$, and an inter-band distortion compensation analog circuit $124_{12}$ and an inter-band distortion compensation analog circuit $124_{21}$ are configured to be separated into two different analog circuits, to thereby achieve the above desired function.

The in-band distortion compensation analog circuit $122_1$ and the in-band distortion compensation analog circuit $122_2$ output in-band intermodulation distortion occurring due to mixing within a single band. Since the in-band intermodulation distortion which is output herein cancels out in-band intermodulation distortion for each band occurring in the amplification unit 130, a distortion signal which is output herein can also be called an in-band distortion compensation signal. In the example of FIG. 1, a single analog baseband signal which is output from the signal generation unit $110_1$ is input to the in-band distortion compensation analog circuit $122_1$, and a single analog baseband signal which is output from the signal generation unit $110_2$ is input to the in-band distortion compensation analog circuit $122_2$.

The inter-band distortion compensation analog circuit $124_{12}$ and the inter-band distortion compensation analog circuit $124_{21}$ output cross-modulation distortion occurring due to mixing between a plurality of bands. The cross-modulation distortion which is output herein cancels out cross-modulation distortion between a plurality of bands occurring in the amplification unit 130. The cross-modulation distortion which is output herein can also be called an inter-band distortion compensation signal. A plurality of analog baseband signals which are output from the signal generation unit $110_1$ and the signal generation unit $110_2$ are input to the inter-band distortion compensation analog circuit $124_{12}$ and the inter-band distortion compensation analog circuit $124_{21}$.

In FIG. 1, a result obtained by synthesizing RF signals which are output from the in-band distortion compensation analog circuit $122_1$ and the inter-band distortion compensation analog circuit $124_{12}$ are indicated as the RF signal $126_1$, and a result obtained by synthesizing RF signals which are output from the in-band distortion compensation analog circuit $122_2$ and the inter-band distortion compensation analog circuit $124_{21}$ are indicated as the RF signal $126_2$.

Through the circuit configurations and operation methods of the signal conversion unit $120_1$ and the signal conversion unit $120_2$ which are shown above, both a signal for compensating for the in-band intermodulation distortion (in-band distortion compensation signal) occurring due to frequency mixing within a single band and a signal for compensating for the cross-modulation distortion (inter-band distortion compensation signal) occurring due to frequency mixing between a plurality of bands can be output using only an analog circuit. Thereby, when the RF signals of a plurality of bands are collectively input to the amplification unit 130, it is possible to compensate for the signal distortion of the amplification unit 130, using an analog circuit.

Meanwhile, when the above desired function is achieved by a digital arithmetic circuit, the above function can be achieved by a single digital arithmetic circuit and a program implemented thereon. However, when an analog circuit having no flexible program function is used, it is difficult to achieve the above desired function through a single circuit. Consequently, in the present invention, the above function can be implemented using an analog circuit by a method in which a circuit that corrects in-band intermodulation distortion and a circuit that corrects cross-modulation distortion are configured separately.

As described above, the signal transmission apparatus 10 of the present exemplary embodiment can compensate for the in-band intermodulation distortion and the cross-modulation distortion occurring when the RF signals of a plurality of bands are collectively input to the amplification unit 130, using an analog circuit. Therefore, in the signal transmission apparatus 10 of the present exemplary embodiment, the modulation bandwidth of a transmission signal is not restricted as in a distortion compensation circuit (digital predistorter) which is implemented using a digital arithmetic circuit. Specifically, in the digital predistorter, a distortion compensation signal is required to be generated at the time scale (several microseconds to several milliseconds) of the modulation bandwidth. For this reason, a high-speed digital arithmetic circuit or a digital-analog converter for generating a distortion compensation signal corresponding to the time scale of the modulation bandwidth is required. However, since it is difficult to achieve the high-speed digital arithmetic circuit or the digital-analog converter corresponding to the time scale of the modulation bandwidth, the modulation bandwidth of the transmission signal becomes restricted. On the other hand, in the signal conversion unit 120 of the present exemplary embodiment, since such a digital arithmetic circuit or a digital-analog converter is not required, the modulation bandwidth of the transmission signal is not restricted. That is, according to the signal transmission apparatus 10 of the present exemplary embodiment, communication speed is not restricted, and thus it is possible to compensate for signal distortion occurring when the RF signals of a plurality of bands are collectively input to the amplification unit 130 even in high-speed communication.

In addition, the signal conversion unit 120 of the present exemplary embodiment can be made smaller in size than the digital predistorter. Specifically, the digital predistorter requires a digital signal processor (DSP), a field programmable gate array (FPGA) mounted on a board, and a digital-analog converter, whereas the signal conversion unit 120 implemented as an analog circuit can be achieved by a small number of active elements and passive elements. In this manner, the signal conversion unit 120 can be mounted on a small-area IC, and thus can be made smaller in size than the digital predistorter requiring board mounting.

In addition, the signal conversion unit 120 can reduce power consumption or production costs to the extent of not requiring a high-performance and high-priced DSP or an FPGA. Regarding the power consumption, the digital pre-distorter requires the power consumption of several W due to a high-performance DSP and an FPGA being used, whereas the power consumption of the signal conversion unit 120 is kept low to several mW.

(Modification Example of First Exemplary Embodiment)

Figure 2:
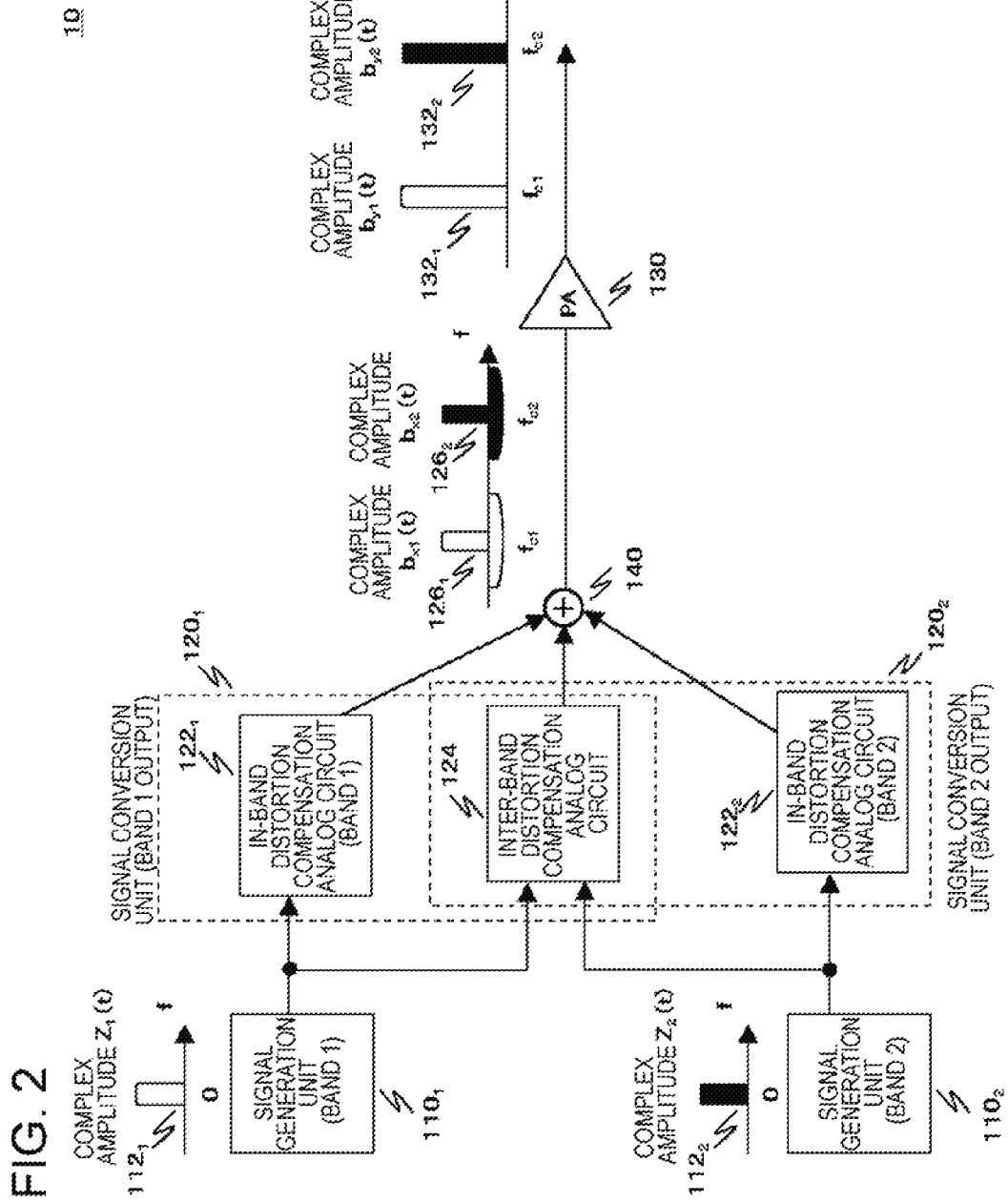
FIG. 2 is a block diagram illustrating a process configuration example of a signal transmission apparatus in a modification example of the first exemplary embodiment of the present invention.

FIG. 2 is a block diagram illustrating a process configuration example of a signal transmission apparatus 10 in a modification example of the first exemplary embodiment of the present invention. As shown in FIG. 2, the inter-band distortion compensation analog circuit 124$_{12}$ and the inter-band distortion compensation analog circuit 124$_{21}$ can also be integrated into an inter-band distortion compensation analog circuit 124 constituted by one circuit block.

The inter-band distortion compensation analog circuit 124 has a combined function of both the inter-band distortion compensation analog circuit 124$_{12}$ and the inter-band distortion compensation analog circuit 124$_{21}$. A plurality of analog baseband signals which are output from the signal generation unit 110$_1$ and the signal generation unit 110$_2$ are input to the inter-band distortion compensation analog circuit 124. Further, the inter-band distortion compensation analog circuit 124 has a function of outputting the signal distortions ($|z_2(t)|^2 z_1(t)$ and $|z_1(t)|^2 z_2(t)$) occurring due to mixing between a plurality of bands, with predetermined amplitudes and phases represented by the complex coefficients of Expression (8), based on the input plurality of analog baseband signals ($z_1(t)$ and $z_2(t)$).

RF signals which are output from the in-band distortion compensation analog circuit 122$_1$ and the in-band distortion compensation analog circuit 122$_2$ and an RF signal which is output from the inter-band distortion compensation analog circuit 124 are synthesized in the synthesizer 140, and are output to the amplification unit 130 as the RF signal 126$_1$ of the band 1 and the RF signal 126$_2$ of the band 2.

In the modification example of the first exemplary embodiment shown in FIG. 2, similarly to the first exemplary embodiment shown in FIG. 1, both a signal for compensating for in-band intermodulation distortion occurring due to frequency mixing within a single band and a signal for compensating for the cross-modulation distortion occurring due to frequency mixing between a plurality of bands can also be output using only an analog circuit.

(Second Exemplary Embodiment)

Figure 3:
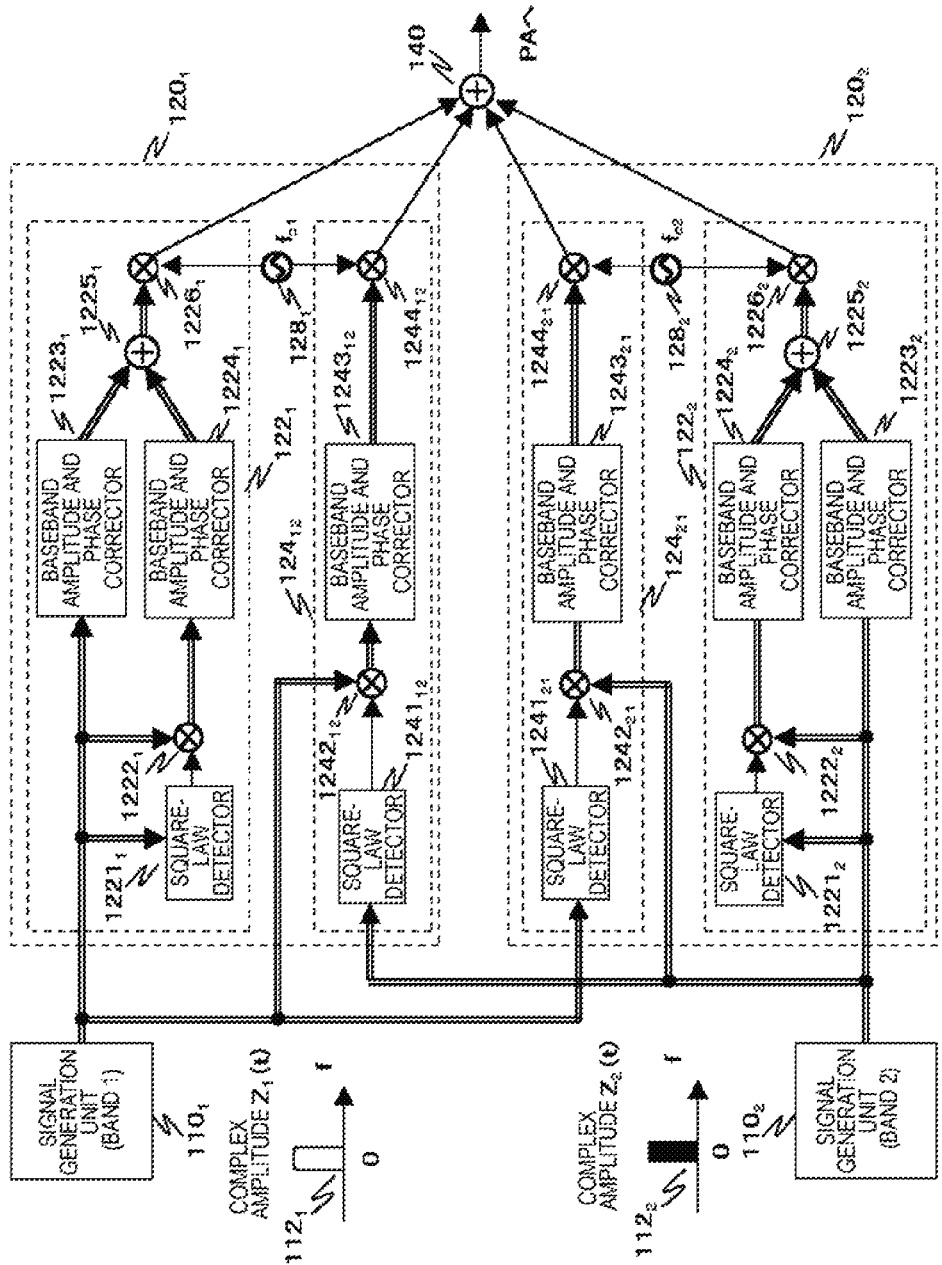
FIG. 3 is a block diagram illustrating a process configuration example of a signal transmission apparatus in a second exemplary embodiment of the present invention.

FIG. 3 is a block diagram illustrating a process configuration example of a signal transmission apparatus 10 in a second exemplary embodiment of the present invention. FIG. 3 shows detailed configuration examples of the in-band distortion compensation analog circuit 122$_1$ and the in-band distortion compensation analog circuit 122$_2$, and those of the inter-band distortion compensation analog circuit 124$_{12}$ and the inter-band distortion compensation analog circuit 124$_{21}$.

In FIG. 3, double lines indicate two signal lines for transferring an in-phase component (I signal) and a quadrature component (Q signal) of a baseband signal. In addition, a normal solid line indicates one signal line for transferring a single baseband signal or an RF signal.

As shown in FIG. 3, the in-band distortion compensation analog circuit 122$_1$ includes a square-law detector 1221$_1$, a multiplier 1222$_1$, baseband amplitude and phase correctors 1223$_1$ and 1224$_1$, an adder 1225$_1$, and a quadrature modulator 1226$_1$. The in-band distortion compensation analog circuit 122$_2$ also includes the same configuration as that of the in-band distortion compensation analog circuit 122$_1$.

The operation and function of the in-band distortion compensation analog circuit 122$_1$ shown in FIG. 3 will be described below.

First, the analog baseband signal 112$_1$ (complex amplitude $z_1(t)$) of the band 1 which is output from the signal generation unit 110$_1$ is input to the in-band distortion compensation analog circuit 122$_1$.

The baseband amplitude and phase corrector 1223$_1$ corrects the amplitude and phase (equivalent to coefficient $p_{(1)}$) of the analog baseband signal 112$_1$, and generates a signal of a complex amplitude $p_{(1)}z_1(t)$, that is, an analog baseband signal corresponding to a first item of Expression (6) on the right side. The analog baseband signal generated in the baseband amplitude and phase corrector 1223$_1$ is output to the adder 1225$_1$. That is, an analog-based signal having no signal distortion is output from the baseband amplitude and phase corrector 1223$_1$.

The square-law detector 1221$_1$ outputs a square value $|z_1(t)|^2$ of the complex amplitude of the analog baseband signal 112$_1$ to the multiplier 1222$_1$. The multiplier 1222$_1$ multiplies the signal $|z_1(t)|^2$ which is output from the square-law detector 1221$_1$ with the complex amplitude $z_1(t)$ of the analog baseband signal 112$_1$, and outputs an analog baseband signal having a complex amplitude $|z_1(t)|^2 z_1(t)$ to the baseband amplitude and phase corrector 1224$_1$. The baseband amplitude and phase corrector 1224$_1$ corrects the amplitude and phase (equivalent to coefficient $q_{(1)3}$) of the input analog-based signal ($|z_1(t)|^2 z_1(t)$), and generates a signal of a complex amplitude $q_{opt(1)3}|z_1(t)|^2 z_1(t)$, that is, an analog baseband signal which corresponds to a second item of Expression (6) on the right side and has a coefficient $q_{opt(1)3}$ optimal for distortion compensation. The analog baseband signal generated in the baseband amplitude and phase corrector 1224$_1$ is output to the adder 1225$_1$. That is, an analog baseband signal for correcting in-band distortion is output from the baseband amplitude and phase corrector 1224$_1$.

The adder 1225$_1$ outputs an analog baseband signal having complex amplitude $p_{(1)}z_1(t)+q_{opt(1)3}|z_1(t)|^2 z_1(t)$ to the quadrature modulator 1226$_1$. The quadrature modulator 1226$_1$ receives a local oscillation (LO) signal of a carrier frequency $f_{c1}$ which is output from a LO signal generator 128$_1$, and performs frequency conversion on the analog baseband signal which is output from the adder 1225$_1$ into an RF signal of the carrier frequency $f_{c1}$. The RF signal which is output from the quadrature modulator 1226$_1$ is input to the synthesizer 140. Through the above process, the in-band distortion compensation analog circuit 122$_1$ outputs the RF signal of the carrier frequency $f_{c1}$ for correcting in-band distortion of the amplification unit 130.

The in-band distortion compensation analog circuit 122$_2$ performs the same process as that in the in-band distortion compensation analog circuit 122$_1$ on the analog baseband signal 112$_2$ (complex amplitude $z_2(t)$) of the band 2, and outputs an RF signal of a carrier frequency $f_{c2}$ for correcting the in-band distortion of the amplification unit 130.

Next, the inter-band distortion compensation analog circuit 124$_{12}$ will be described. The inter-band distortion compensation analog circuit 124$_{12}$ includes a square-law detector 1241$_{12}$, a multiplier 1242$_{12}$, a baseband amplitude and phase corrector 1243$_{12}$, and a quadrature modulator 1244$_{12}$. The inter-band distortion compensation analog circuit 124$_{21}$ also includes the same configuration as that of the inter-band distortion compensation analog circuit 124$_{12}$.

The analog baseband signal 112$_2$ (complex amplitude $z_2(t)$) of the band 2 is input to the square-law detector 1241$_{12}$, and the amplitude square value $|z_2(t)|^2$ thereof is output to the multiplier $1242_{12}$. The amplitude square value $|z_2(t)|^2$ of the analog baseband signal $112_2$ of the band 2 and the analog baseband signal $112_1$ (complex amplitude $z_1(t)$) of the band 1 are input to the multiplier $1242_{12}$, and an analog baseband signal in which a product $|z_2(t)|^2 z_1(t)$ of the both is set to a complex amplitude is output to the baseband amplitude and phase corrector $1243_{12}$. The baseband amplitude and phase corrector $1243_{12}$ corrects the amplitude and phase (equivalent to coefficient $r_{(1)3}$) of the input analog baseband signal (complex amplitude $|z_2(t)|^2 z_1(t)$), and generates a signal of a complex amplitude $r_{opt(1)3}|z_2(t)|^2 z_1(t)$, that is, an analog baseband signal which corresponds to a third item of Expression (6) on the right side and has a coefficient $r_{opt(1)3}$ optimal for distortion compensation. The analog baseband signal generated in the baseband amplitude and phase corrector $1243_{12}$ is output to the quadrature modulator $1244_{12}$. That is, an analog baseband signal for correcting inter-band distortion is output from the baseband amplitude and phase corrector $1243_{12}$. The baseband amplitude and phase corrector $1243_{12}$ can also be called a compensation signal generation unit.

The quadrature modulator $1244_{12}$ receives the LO signal of the carrier frequency $f_{c1}$ which is output from the LO signal generator $128_1$, and performs frequency conversion on the analog baseband signal which is output from the baseband amplitude and phase corrector $1243_{12}$ into the RF signal of the carrier frequency $f_{c1}$. The RF signal which is output from the quadrature modulator $1244_{12}$ is input to the synthesizer 140. Through the above process, the inter-band distortion compensation analog circuit $124_{12}$ outputs the RF signal of the carrier frequency $f_{c1}$ for correcting the inter-band distortion of the amplification unit 130.

In the inter-band distortion compensation analog circuit $124_{21}$, the analog baseband signal $112_1$ of the band 1 rather than the analog baseband signal $112_2$ of the band 2 is input to the square-law detector $1241_{21}$, and the same process as that in the inter-band distortion compensation analog circuit $124_{12}$ is performed. Through this process, the inter-band distortion compensation analog circuit $124_{21}$ outputs the RF signal of the carrier frequency $f_{c2}$ for correcting the inter-band distortion of the amplification unit 130.

Meanwhile, the multiplier and the adder shown in FIG. 3 can be constituted by operational amplifier circuits, as in the example disclosed in Non-Patent Document 2. The square-law detectors shown in FIG. 3 can also be achieved by outputting each of the square value of the I signal and the square value of the Q signal of the analog baseband signal using two respective multipliers, and adding and outputting the square value of the I signal and the square value of the Q signal, using one adder.

Figure 4:
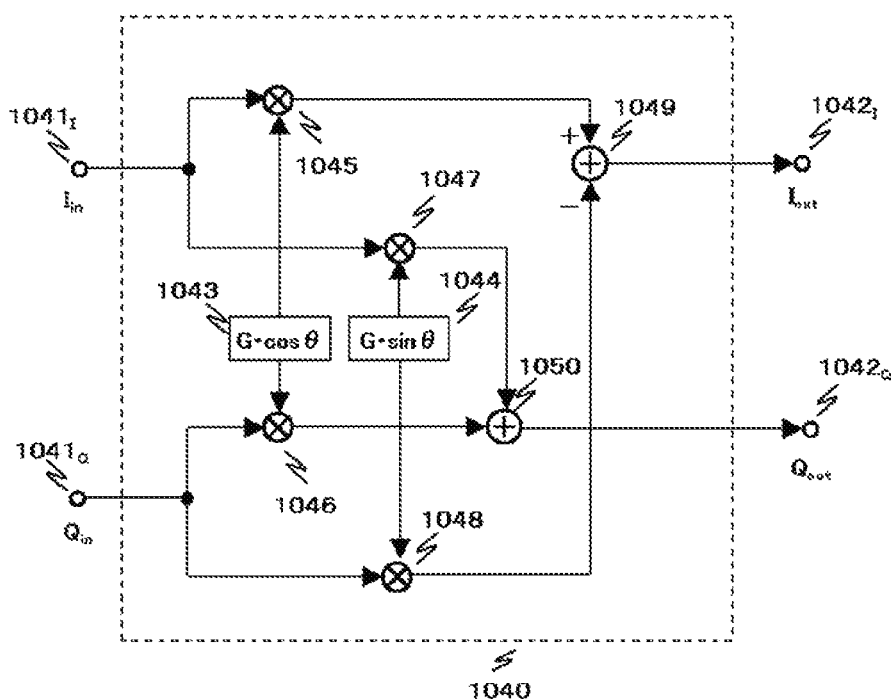
FIG. 4 is a diagram illustrating an example of an analog baseband amplitude and phase correction circuit.

The baseband amplitude and phase correctors 1223, 1224, and 1243 can be implemented by, for example, the analog baseband amplitude and phase correction circuit 1040 shown in FIG. 4. FIG. 4 is a diagram illustrating an example of the analog baseband amplitude and phase correction circuit 1040. In the example of FIG. 4, an I signal $I_{in}$ and a Q signal $Q_{in}$ of an analog baseband signal $z_{in}$ ($z_{in}=I_{in}+jQ_{in}$) are input to terminals $1041_I$ and $1041_Q$, respectively. The analog baseband amplitude and phase correction circuit 1040 has a function of performing constant multiplication of the amplitude of the input analog baseband signal $z_{in}$ by a gain G, and shifting the phase thereof based on θ to output the shifted phase. An I signal $I_{out}$ and a Q signal $Q_{out}$ of an analog baseband signal $z_{out}$ ($z_{out}=I_{out}+jQ_{out}$) which are output from the analog baseband amplitude and phase correction circuit 1040 are output from terminals $1042_I$ and $1042_Q$, respectively. The signals $I_{out}$ and $Q_{out}$ which are output from the terminals $1042_I$ and $1042_Q$ are represented by Expression (9).

$$I_{out}=Re[G \cdot \exp(j\theta) \cdot z_{in}]=G \cdot \cos\theta \cdot I_{in} - G \cdot \sin\theta \cdot Q_{in}$$

$$Q_{out}=Im[G \cdot \exp(j\theta) \cdot z_{in}]=G \cdot \sin\theta \cdot I_{in} + G \cdot \cos\theta \cdot Q_{in} \quad \text{[Expression 9]}$$

In order to achieve signal outputs represented by Expression (9), the analog baseband amplitude and phase correction circuit 1040 includes at least signal generators 1043 and 1044, multipliers 1045 to 1048, a subtractor 1049, and an adder 1050. The multipliers 1045 to 1048, the subtractor 1049, and the adder 1050 can be constituted by operational amplifier circuits, as in the example disclosed in Non-Patent Document 2.

The signal generator 1043 outputs a signal of a fixed value $G \cdot \cos\theta$ to the multipliers 1045 and 1046. The signal generator 1044 output a signal of a fixed value $G \cdot \sin\theta$ to the multipliers 1047 and 1048. Here, parameters G and θ are set to necessary values so as to conform to distortion which is compensated for by the analog baseband amplitude and phase correction circuit 1040. The input I signal $I_{in}$ is input to the multipliers 1045 and 1047, and the input Q signal $Q_{in}$ is input to the multipliers 1046 and 1048. The multiplier 1045 outputs a product of the input I signal $I_{in}$ and the signal $G \cdot \cos\theta$ which is output from the signal generator 1043. The multiplier 1046 outputs a product of the input Q signal $Q_{in}$ and the signal $G \cdot \cos\theta$ which is output from the signal generator 1043. The multiplier 1047 outputs a product of the input I signal $I_{in}$ and the signal $G \cdot \sin\theta$ which is output from the signal generator 1044. The multiplier 1048 outputs a product of the input Q signal $Q_{in}$ and the signal $G \cdot \sin\theta$ which is output from the signal generator 1044. The output signals of the multipliers 1045 and 1048 are input to the subtractor 1049, and the output signal of the multipliers 1046 and 1047 are input to the adder 1050. The subtractor 1049 synthesizes the two input signals, and outputs the result to the terminal $1042_I$. The adder 1050 synthesizes the two input signals, and outputs the result to the terminal $1042_Q$. Through the above process, signals given by Expression (9) are output from the terminals $1042_I$ and $1042_Q$.

From the above, the in-band distortion compensation analog circuit $122_1$ shown in FIG. 3 generates an in-band distortion compensation signal for compensating for in-band intermodulation distortion of the band 1 in in-band intermodulation distortion occurring by performing frequency-mixing on RF signals of a single band in the amplification unit 130. Specifically, the in-band distortion compensation analog circuit $122_1$ generates an in-band distortion compensation signal of the band 1, using parameters of in-band intermodulation distortion occurring by performing frequency-mixing on RF signals of the band 1 in the amplification unit 130. The in-band distortion compensation analog circuit $122_1$ causes the generated in-band distortion compensation signal to be carried by the RF signal of the band 1 (carrier frequency $f_{c1}$). In addition, the in-band distortion compensation analog circuit $122_2$ generates an in-band distortion compensation signal for compensating for in-band intermodulation distortion of the band 2 in in-band intermodulation distortion occurring by performing frequency-mixing on the RF signals of a single band in the amplification unit 130. Specifically, the in-band distortion compensation analog circuit $122_2$ generates an in-band distortion compensation signal of the band 2, using parameters of in-band intermodulation distortion occurring by performing frequency-mixing on the RF signals of the band 2 in the amplification unit 130. The in-band distortion compensation analog circuit $122_2$ causes the generated in-band distortion compensation signal to be carried by the RF signal of the band 2 (carrier frequency $f_{c2}$).

In addition, the inter-band distortion compensation analog circuit $124_{12}$ generates an inter-band distortion compensation signal for compensating for cross-modulation distortion occurring due to frequency mixing between the band 1 and the band 2 in the amplification unit 130, and causes the inter-band distortion compensation signal to be carried by the RF signal of the band 1 (carrier frequency $f_{c1}$). In addition, the inter-band distortion compensation analog circuit $124_{21}$ generates an inter-band distortion compensation signal for compensating for cross-modulation distortion between the bands 2-1 in cross-modulation occurring by mixing different RF signals of two bands in the amplification unit 130, and causes the inter-band distortion compensation signal to be carried by the RF signal of the band 2 (carrier frequency $f_{c2}$).

Through the process described in the present exemplary embodiment, the signal conversion unit $120_1$ and the signal conversion unit $120_2$ shown in FIG. 3 can output the output signals shown in Expression (5) and Expression (8) of the first exemplary embodiment. That is, in the second exemplary embodiment, as is the case with the first exemplary embodiment, both the in-band distortion compensation signal for compensating for in-band intermodulation distortion occurring due to frequency mixing within a single band and the inter-band distortion compensation signal for compensating for cross-modulation distortion occurring due to frequency mixing between a plurality of bands can be output using only an analog circuit.

(Modification Example of Second Exemplary Embodiment)

Figure 5:
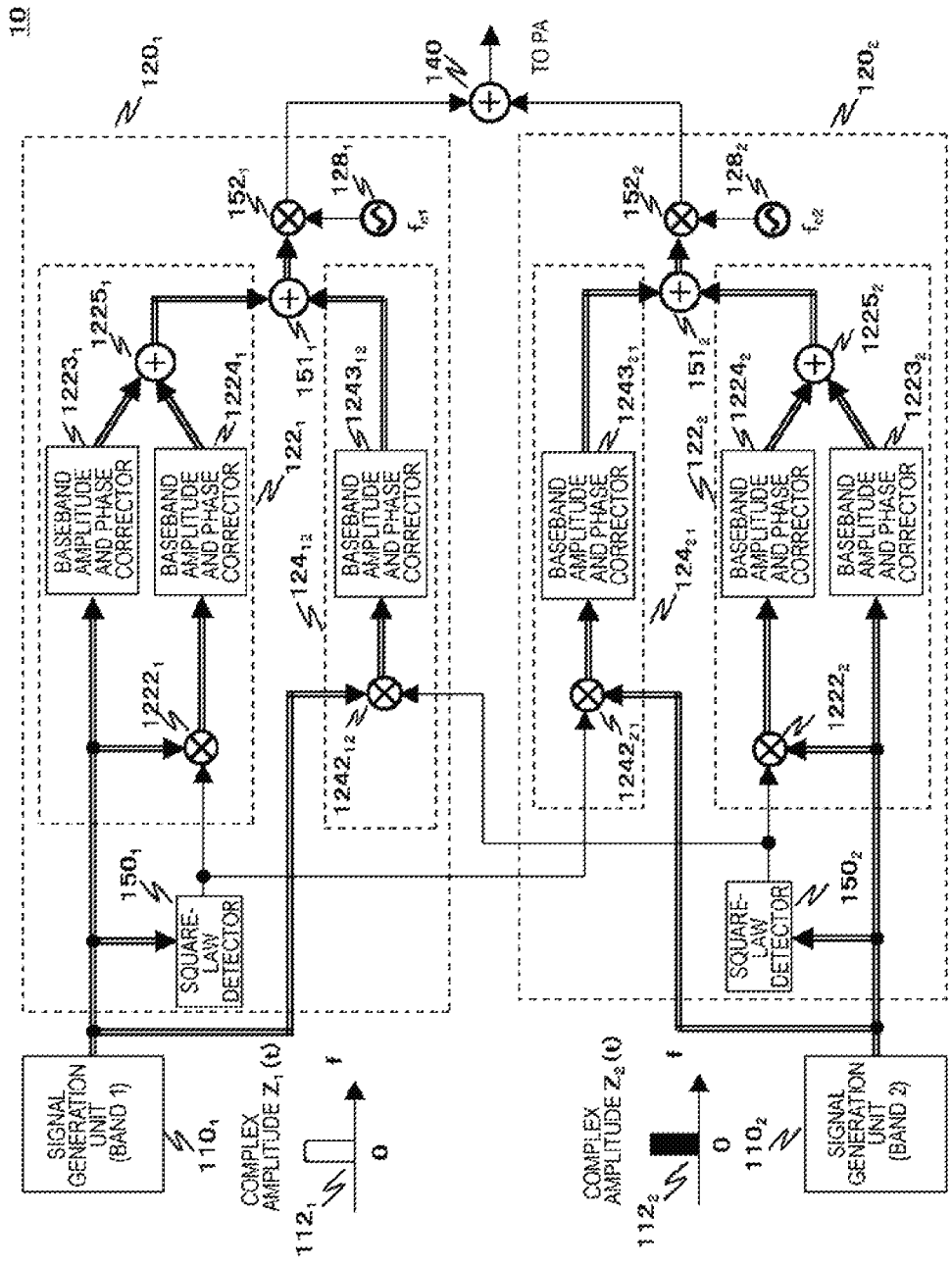
FIG. 5 is a block diagram illustrating a process configuration example of a signal transmission apparatus in the modification example of the second exemplary embodiment of the present invention.

FIG. 5 is a block diagram illustrating a process configuration example of a signal transmission apparatus 10 in a modification example of the second exemplary embodiment of the present invention.

In FIG. 5, the square-law detectors $1221_1$ and $1241_{21}$ in FIG. 3 are integrated into one square-law detector $150_1$. Both of the square-law detectors $1221_1$ and $1241_{21}$ have the same function of outputting the amplitude square value of the analog baseband signal $112_1$ which is output from the signal generation unit $110_1$, and thus can be integrated into the square-law detector $150_1$.

Similarly, in FIG. 5, the square-law detectors $1221_2$ and $1241_{12}$ in FIG. 3 are integrated into one square-law detector $150_2$.

In addition, in FIG. 5, the quadrature modulators $1226_1$ and $1244_{12}$ in FIG. 3 are integrated into one quadrature modulator $152_1$. Further, in FIG. 5, an adder $151_1$ is added, and the output signal of the in-band distortion compensation analog circuit $122_1$ and the output signal of the inter-band distortion compensation analog circuit $124_{12}$ are synthesized in the adder $151_1$. An output signal from the adder $151_1$ is converted in frequency into the RF signal of the carrier frequency $f_{c1}$ in the quadrature modulator $152_1$. The RF signal which is output from the quadrature modulator $152_1$ is input to the synthesizer 140.

In the signal transmission apparatus 10 shown in FIG. 5, the output signal of the in-band distortion compensation analog circuit $122_1$ and the output signal of the inter-band distortion compensation analog circuit $124_{12}$ are synthesized by the adder $151_1$, and then converted in frequency into an RF signal by the single quadrature modulator $152_1$. On the other hand, in the signal transmission apparatus 10 shown in FIG. 3, the output signal of the in-band distortion compensation analog circuit $122_1$ and the output signal of the inter-band distortion compensation analog circuit $124_{12}$ are converted in frequency into RF signals, respectively, by the individual quadrature modulators $1226_1$ and $1244_{12}$. In either method, signals which are input to the amplification unit 130 are the same as each other.

Similarly, in FIG. 5, an adder $151_2$ is added, and quadrature modulators $1226_2$ and $1244_{21}$ are integrated into one quadrature modulator $152_2$.

In the signal transmission apparatus 10 of FIG. 5 and the signal transmission apparatus 10 of FIG. 3, implementation methods are different from each other, but achieved functions are the same as each other.

(Third Exemplary Embodiment)

Figure 6:
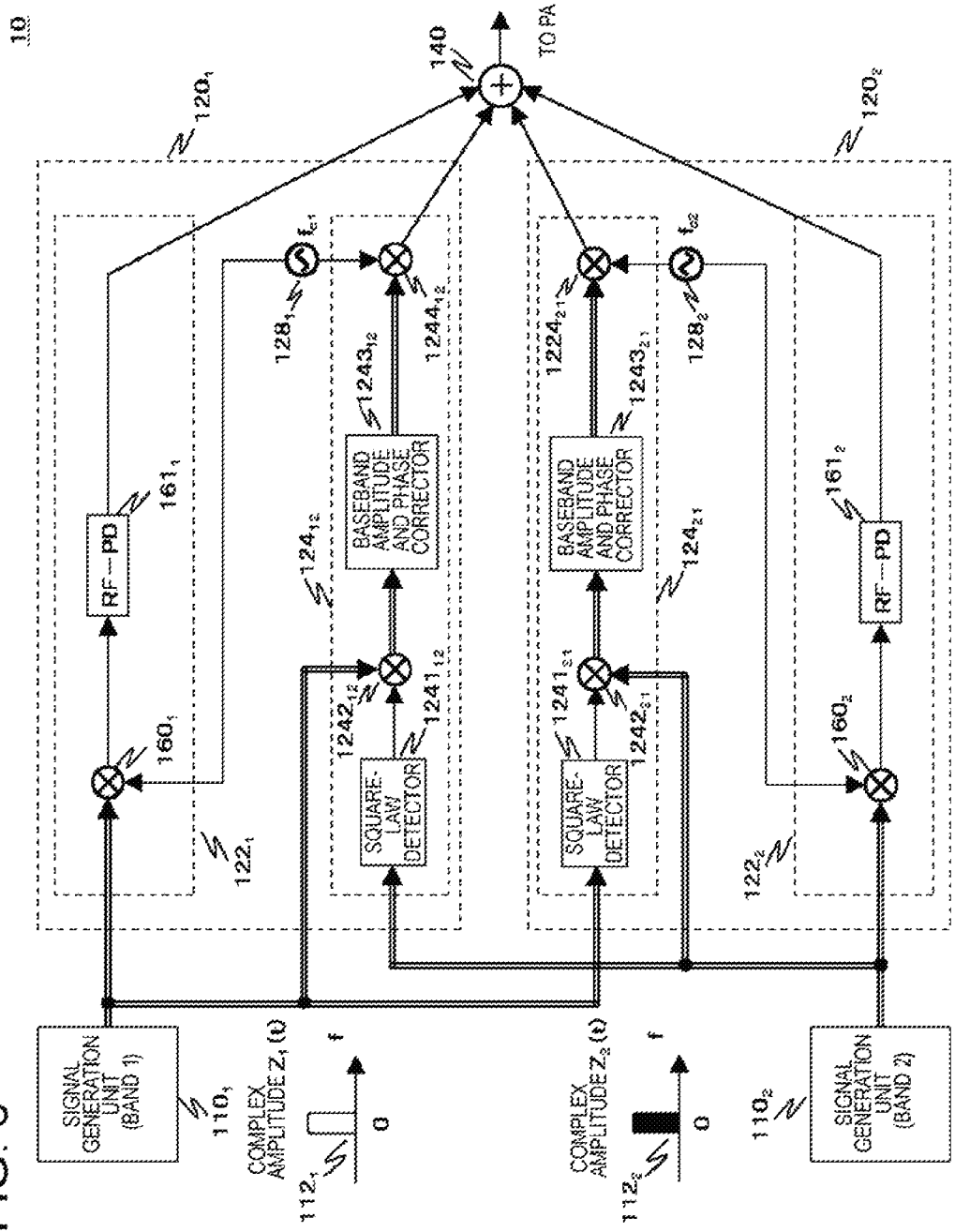
FIG. 6 is a block diagram illustrating a process configuration example of a signal transmission apparatus in a third exemplary embodiment of the present invention.

FIG. 6 is a block diagram illustrating a process configuration example of a signal transmission apparatus 10 in a third exemplary embodiment of the present invention. The signal transmission apparatus 10 of FIG. 6 is the same as the signal transmission apparatus 10 of FIG. 3, except for the following points. Specifically, in FIG. 6, the in-band distortion compensation analog circuit $122_1$ is constituted by a quadrature modulator $160_1$ and an RF-PD $161_1$, and the in-band distortion compensation analog circuit $122_2$ is constituted by a quadrature modulator $160_2$ and an RF-PD $161_2$.

In the present exemplary embodiment, the analog baseband signal $112_1$ which is output from the signal generation unit $110_1$ is converted into the RF signal of the band 1 by the quadrature modulator $160_1$ and the LO signal generator $128_1$. The RF signal of the band 1 which is output from the quadrature modulator $160_1$ is input to the RF-PD $161_1$. The RF-PD $161_1$ receives an RF signal input of the band 1, generates an in-band distortion compensation signal $q_{(1)3}|z_1(t)|^2 z_1(t)$ of the band 1 of the amplification unit 130, and causes the generated signal to be carried by the RF signal of the band 1. The RF signal by which the in-band distortion compensation signal $q_{(1)3}|z_1(t)|^2 z_1(t)$ of the band 1 is carried is output toward the synthesizer 140. In addition, the analog baseband signal $112_2$ which is output from the signal generation unit $110_2$ is converted into the RF signal of the band 2 by the quadrature modulator $160_2$ and a LO signal generator $128_2$. The RF signal of the band 2 which is output from the quadrature modulator $160_2$ is input to the RF-PD $161_2$. The RF-PD $161_2$ receives an RF signal input of the band 2, generates an in-band distortion compensation signal $q_{(2)3}|z_2(t)|^2 z_2(t)$ of the band 2 of the amplification unit 130, and causes the generated signal to be carried by the RF signal of the band 2. The RF signal by which the in-band distortion compensation signal $q_{(2)3}|z_2(t)|^2 z_2(t)$ of the band 2 is carried is output toward the synthesizer 140.

Figure 7:
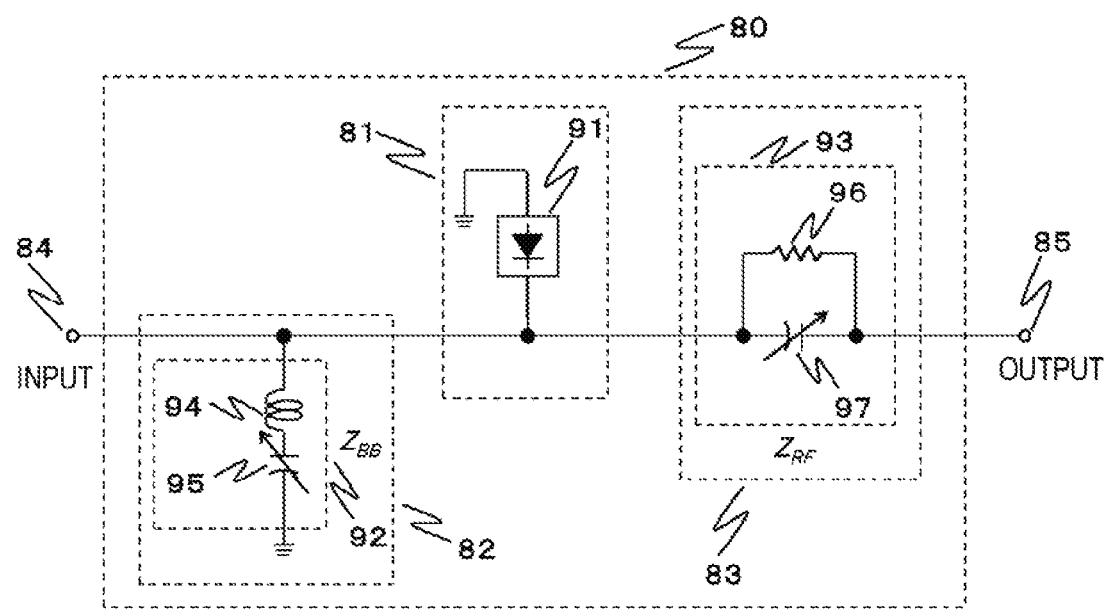
FIG. 7 is a diagram illustrating an intermodulation distortion generation circuit disclosed in Patent Document 9.

It is preferable that the RF-PD $161_1$ and the RF-PD $161_2$ have a function capable of changing the amplitudes and phases of the complex amplitudes $q_{(1)3}|z_1(t)|^2 z_1(t)$ and $q_{(2)3}|z_2(t)|^2 z_2(t)$ of distortion compensation signals included in RF signals which are output by these RF-PDs themselves. The RF-PD $161_1$ and the RF-PD $161_2$ can be implemented using, for example, an intermodulation distortion generation circuit 80 as shown in FIG. 7. FIG. 7 is a diagram illustrating the intermodulation distortion generation circuit 80 disclosed in Patent Document 9.

Specifically, the intermodulation distortion generation circuit 80 shown in FIG. 7 includes a distortion generation circuit 81 that generates third-order intermodulation distortion, a phase adjustment circuit 82 that adjusts the phase of the third-order intermodulation distortion, and an amplitude adjustment circuit 83 that adjusts the amplitude of the third-order intermodulation distortion.

The distortion generation circuit 81 generates third-order intermodulation distortion required for distortion compensation, using a built-in nonlinear element 91. The nonlinear element 91 is implemented using, for example, a transistor or a diode element.

The phase adjustment circuit 82 sets a load impedance $Z_{BB}$ in the differential frequency band impedance of the distortion generation circuit 81, to an optimum value, using a built-in impedance element 92. The impedance element 92 includes an inductance element 94 and a variable capacitive element 95. The impedance element 92 can set the load impedance $Z_{BB}$ in the differential frequency band impedance of the distortion generation circuit 81, to an optimum value, based on the value of the variable capacitive element 95, and set the phase of the third-order intermodulation distortion which is output from the distortion generation circuit 81, to an optimum value. Meanwhile, the "differential frequency band" refers to a frequency band equivalent to the modulation bandwidth of a modulated wave which is input, that is, a frequency band of a baseband. In addition, the impedance element 92 is not limited to the configuration of FIG. 7, and can be implemented in various forms using passive elements such as a capacitive element, an inductance element, and a resistive element.

The amplitude adjustment circuit 83 sets a load impedance $Z_{RF}$ in the RF fundamental wave band of the distortion generation circuit 81, to an optimum value, using the built-in impedance element 93. The impedance element 93 includes a resistive element 96 and a variable capacitive element 97. The amplitude adjustment circuit 83 can set the load impedance $Z_{RF}$ in the RF fundamental wave band of the distortion generation circuit 81, to an optimum value, based on the value of the variable capacitive element 97, and set the amplitude of the third-order intermodulation distortion which is output from the distortion generation circuit 81, to an optimum value. Meanwhile, the "RF fundamental wave band" indicates a carrier wave of an input signal and a frequency band in the vicinity thereof. In addition, the impedance element 93 is not limited to the configuration of FIG. 7, and can be implemented in various forms using passive elements such as a capacitive element, an inductance element, and a resistive element.

The RF-PD 161$_1$ and the RF-PD 161$_2$ can change the amplitudes and phases (that is, coefficients $q_{(1)3}$ and $q_{(2)3}$) of the complex amplitudes $q_{(1)3}|z_1(t)|^2 z_1(t)$ and $q_{(2)3}|z_2(t)|^2 z_2(t)$ of the distortion compensation signals to desired values, through the function of the intermodulation distortion generation circuit 80 that outputs the third-order intermodulation distortion having a desired amplitude and phase. The amplitudes and phases of the complex amplitudes $q_{(1)3}|z_1(t)|^2 z_1(t)$ and $q_{(2)3}|z_2(t)|^2 z_2(t)$ of the distortion compensation signals are equivalent to the amplitude and phase of the third-order intermodulation distortion. The RF-PD 161$_1$ and the RF-PD 161$_2$ can output optimum distortion compensation signals $q_{opt(1)3}|z_1(t)|^2 z_1(t)$ and $q_{opt(2)3}|z_2(t)|^2 z_2(t)$ through the function of setting the amplitude and phase of the third-order intermodulation distortion.

Meanwhile, the RF-PD 161$_1$ and the RF-PD 161$_2$ is not limited to the intermodulation distortion generation circuit 80 of FIG. 7. When a circuit is used which has a terminal for inputting and outputting an RF signal, and has a function of changing the amplitudes and phases of the complex amplitudes $q_{(1)3}|z_1(t)|^2 z_1(t)$ and $q_{(2)3}|z_2(t)|^2 z_2(t)$ of the distortion compensation signals to desired values and outputting the results, a circuit having any configuration may be used.

For example, in an RF circuit capable of setting the input power dependency (AM-AM characteristics/AM-PM characteristics) of a gain and a phase to a desired value, it is also possible to achieve a function of changing the amplitudes and phases of the complex amplitudes $q_{(1)3}|z_1(t)|^2 z_1(t)$ and $q_{(2)3}|z_2(t)|^2 z_2(t)$ of the distortion compensation signals to desired values and outputting the results. As a basis of the above, Non-Patent Document 3 discloses that the amplitude and phase of the third-order intermodulation distortion are determined by the input power dependency (AM-AM/AM-PM characteristics) of a gain and a phase. Therefore, the RF-PD 161$_1$ and the RF-PD 161$_2$ may use an RF circuit capable of setting the input power dependency (AM-AM/AM-PM characteristics) of a gain and a phase to a desired value.

As described above, in the present exemplary embodiment, it is also possible to obtain the same effect as that of the first exemplary embodiment.

Meanwhile, in the second exemplary embodiment, the in-band distortion compensation signals $q_{opt(1)3}|z_1(t)|^2 z_1(t)$ and $q_{opt(2)3}|z_2(t)|^2 z_2(t)$ are generated in a domain of an analog baseband, and then the in-band distortion compensation signals are converted into RF signals using the quadrature modulator 1226$_1$ and the quadrature modulator 1226$_2$.

On the other hand, in the present exemplary embodiment, RF signals are generated in the quadrature modulator 160$_1$ and the quadrature modulator 160$_2$, and then RF signals by which in-band intermodulation distortion compensation signal $q_{opt(1)3}|z_1(t)|^2 z_1(t)$ and $q_{opt(2)3}|z_2(t)|^2 z_2(t)$ are carried are generated in the RF-PD 161$_1$ and the RF-PD 161$_2$.

This means that frequency domains for generating in-band distortion compensation signals in the in-band distortion compensation analog circuit 122$_1$ and the in-band distortion compensation analog circuit 122$_2$ of the present invention may be either an analog baseband frequency domain or an RF frequency domain.

(Fourth Exemplary Embodiment)

Figure 8:
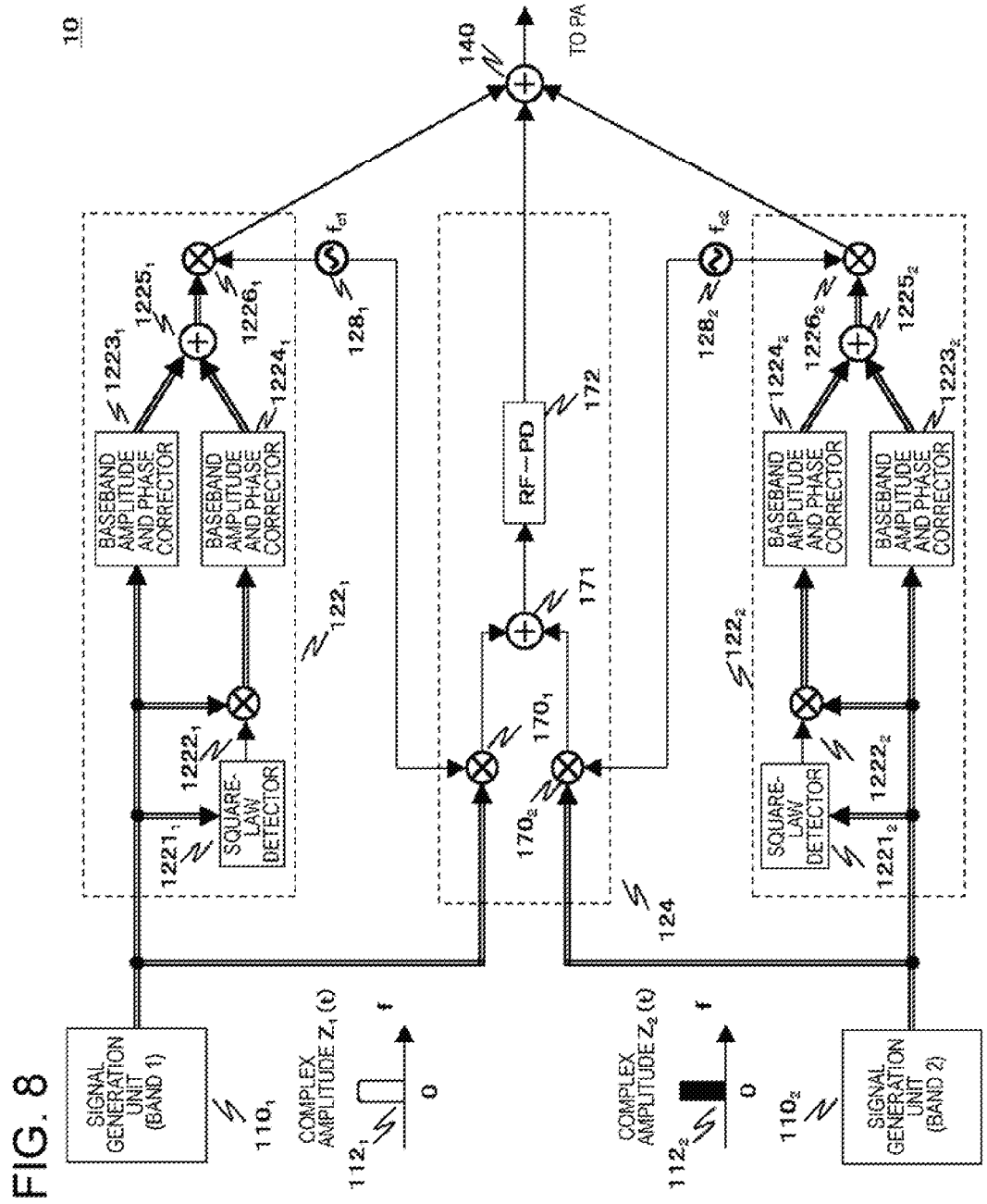
FIG. 8 is a block diagram illustrating a process configuration example of a signal transmission apparatus in a fourth exemplary embodiment of the present invention.

FIG. 8 is a block diagram illustrating a process configuration example of a signal transmission apparatus 10 in a fourth exemplary embodiment of the present invention. As shown in FIG. 8, the signal transmission apparatus 10 of the present exemplary embodiment is based on the modification example of the first exemplary embodiment shown in FIG. 2. Meanwhile, the signal transmission apparatus 10 of FIG. 8 is the same as the signal transmission apparatus 10 of FIG. 3, except for the following points. Specifically, the inter-band distortion compensation analog circuit 124 is constituted by quadrature modulators 170$_1$ and 170$_2$, a synthesizer 171, and an RF-PD 172.

Similarly to the RF-PD 161$_1$ and the RF-PD 161$_2$ shown in FIG. 6, it is preferable that the RF-PD 172 shown in FIG. 8 has a function capable of changing the amplitude and phase of a distortion correction component included in an RF signal which is output by the RF-PD itself. For this reason, the RF-PD 172 can be implemented using the intermodulation distortion generation circuit 80, for example, as shown in FIG. 7.

Next, the operation of the inter-band distortion compensation analog circuit 124 shown in FIG. 8 will be described.

The analog baseband signal 112$_1$ (complex amplitude $z_1(t)$) which is output from the signal generation unit 110$_1$ and the analog baseband signal 112$_2$ (complex amplitude $z_2(t)$) which is output from the signal generation unit 110$_2$ are input to the inter-band distortion compensation analog circuit 124. The analog baseband signal 112$_1$ is output to the quadrature modulator 170$_1$, and the analog baseband signal 112$_2$ is output to the quadrature modulator 170$_2$.

The analog baseband signal 112$_1$ which is output from the signal generation unit 110$_1$ and the signal generation unit 110$_2$ is converted into the RF signals of the band 1 and the band 2, using the quadrature modulator $170_1$ and the LO signal generator $128_1$. In addition, the analog baseband signal $112_2$ which is output from the signal generation unit $110_2$ is converted into the RF signal of the band 2, using the quadrature modulator $170_2$ and the LO signal generator $128_2$. The synthesizer 140 synthesizes the RF signals of the band 1 and the band 2 which are respectively output from the quadrature modulator $170_1$ and the quadrature modulator $170_2$, and outputs the result to the RF-PD 172.

The RF-PD 172 outputs an RF signal compensating for cross-modulation distortion occurring due to frequency mixing of RF signals between a plurality of bands in the amplification unit 130, to the synthesizer 140.

Hereinafter, the RF signal which is output by the RF-PD 172 will be described in detail.

Both the RF signals of the band 1 and the band 2 are input to the RF-PD 172. For this reason, the RF signals of the band 1 and the band 2 are output from the RF-PD 172. The complex amplitude of the RF signal of the band 1 which is output from the RF-PD 172 is set to $b_{RFPD1}(t)$, and the complex amplitude of the RF signal of the band 2 is set to $b_{RFPD2}(t)$. The complex amplitudes $b_{RFPD1}(t)$ and $b_{RFPD2}(t)$ of the RF signal which is output from the RF-PD 172 are represented by the following Expression (10).

$$b_{RFPD1}(t) = p_{RFPD(1)}z_1(t) + q_{RFPD(1)3}|z_1(t)|^2 z_1(t) + r_{RFPD(1)3}|z_2(t)|^2 z_1(t) + \ldots$$

$$b_{RFPD2}(t) = p_{RFPD(2)}z_2(t) + q_{RFPD(2)3}|z_2(t)|^2 z_2(t) + r_{RFPD(2)3}|z_1(t)|^2 z_2(t) + \ldots \quad \text{[Expression 10]}$$

The RF-PD 172 has two circuit parameters (a, b) capable of changing its characteristics. Respective coefficients ($g_{RFPD(1)3}$, $g_{RFPD(2)3}$, $r_{RFPD(1)3}$, $r_{RFPD(2)3}$) of the complex amplitudes $b_{RFPD1}(t)$ and $b_{RFPD2}(t)$ are assumed to be capable of being changed as a function of the circuit parameters (a, b). In a case of the intermodulation distortion generation circuit 80 shown in FIG. 7, a specific example of the circuit parameters (a, b) is load impedance $Z_{BB}$ in the differential frequency band impedance of the distortion generation circuit 81 which is set in the phase adjustment circuit 82, and load impedance $Z_{RF}$ in the RF fundamental wave band of the distortion generation circuit 81 which is set in the amplitude adjustment circuit 83. That is, in the intermodulation distortion generation circuit shown in FIG. 7, it is possible to adjust the respective coefficients of the complex amplitudes $b_{RFPD1}(t)$ and $b_{RFPD2}(t)$ by adjusting the load impedance $Z_{BB}$ and the load impedance $Z_{RF}$. The third item of Expression (10) on the right side is equivalent to an inter-band distortion compensation signal for compensating for cross-modulation distortion occurring by performing frequency-mixing on the RF signals of a plurality of bands in the amplification unit 130.

Meanwhile, as obvious from the second item of Expression 10 on the right side, in a process of generating the inter-band distortion compensation signal, in-band intermodulation distortion of each single band occurs as well. The in-band intermodulation distortion occurring herein is dependent on the circuit parameters (a, b) of the RF-PD 172. Therefore, as described later, the in-band distortion compensation analog circuit $122_1$ and the in-band distortion compensation analog circuit $122_2$ generate signals for compensating for in-band intermodulation distortion occurring in the amplification unit 130 and in-band intermodulation distortion occurring in the RF-PD 172 collectively.

The circuit parameters (a, b) are set to satisfy the following Expression (11) so that the RF-PD 172 can output an optimum inter-band distortion compensation signal. That is, the RF-PD 172 sets the circuit parameters (a, b) based on the cross-modulation distortion occurring by performing frequency-mixing on the RF signals of a plurality of bands in the amplification unit 130, and generates an inter-band distortion compensation signal for canceling out the cross-modulation distortion. The RF-PD 172 can also be called a compensation signal generation unit.

$$r_{RFPD(1)3}(a,b) = r_{opt(1)3}$$

$$r_{RFPD(2)3}(a,b) = r_{opt(2)3} \quad \text{[Expression 11]}$$

Expression (11) is a simultaneous equation constituted by two unknown parameters (a, b) and two equations. The values of the circuit parameters (a, b) are determined as a solution of the simultaneous equations represented by Expression (11).

Next, signals to be output by the in-band distortion compensation analog circuit $122_1$ and the in-band distortion compensation analog circuit $122_2$ will be described.

The in-band distortion compensation signal which is output by the in-band distortion compensation analog circuit $122_1$ is indicated as $q_{APD(1)3}|z_1(t)|^2 z_1(t)$. In addition, the in-band distortion compensation signal which is output by the in-band distortion compensation analog circuit $122_2$ is indicated as $q_{APD(2)3}|z_2(t)|^2 z_2(t)$. As described in the second exemplary embodiment, the coefficients $q_{APD(1)3}$ and $q_{APD(2)3}$ of the in-band distortion compensation signal can be set to any values, respectively, by a baseband amplitude and phase corrector 1025 and a baseband amplitude and phase corrector 1026.

The in-band distortion compensation signal which is input to the amplification unit 130 through the synthesizer 140 is obtained by synthesizing an in-band distortion compensation signal which is output from the in-band distortion compensation analog circuit $122_1$ and an in-band distortion compensation signal which is output from the in-band distortion compensation analog circuit $122_2$. Therefore, the coefficient $q_{APD(1)3}$ of the in-band distortion compensation signal which is output from the in-band distortion compensation analog circuit $122_1$ and the coefficient $q_{APD(2)3}$ of the in-band distortion compensation signal which is output from the in-band distortion compensation analog circuit $122_2$ are preferably set to values satisfying the following Expression (12).

$$q_{APD(1)3} + q_{RFPD(1)3}(a,b) = q_{opt(1)3}$$

$$q_{APD(2)3} + q_{RFPD(2)3}(a,b) = q_{opt(2)3} \quad \text{[Expression 12]}$$

The left sides of Expression (12) are coefficients of in-band distortion compensation signals $[q_{APD(1)3} + q_{RFPD(1)3}(a,b)]|z_1(t)|^2 z_1(t)$ and $[q_{APD(2)3} + q_{RFPD(2)3}(a,b)]|z_2(t)|^2 z_2(t)$ which are input to the amplification unit 130 through the synthesizer 140. Specifically, the first items of Expression (12) on the left sides are parameters relating to in-band intermodulation distortion occurring in the inter-band distortion compensation analog circuit 124. In addition, the second items of Expression (12) on the left sides are parameters relating to in-band intermodulation distortion occurring in the amplification unit 130. As represented by Expression (12), the above coefficients are set to optimum values $q_{opt(1)3}$ and $q_{opt(2)3}$, and thus it is possible to compensate for in-band signal distortion of each band which is generated in the amplification unit 130.

Through the above operation, in the fourth exemplary embodiment, as is the case with the first exemplary embodiment, both the signal for compensating for in-band intermodulation distortion occurring due to frequency mixing within a single band and the signal for compensating for cross-modulation distortion occurring due to frequency mixing between a plurality of bands can also be output using only an analog circuit.

(Fifth Exemplary Embodiment)

Figure 9:
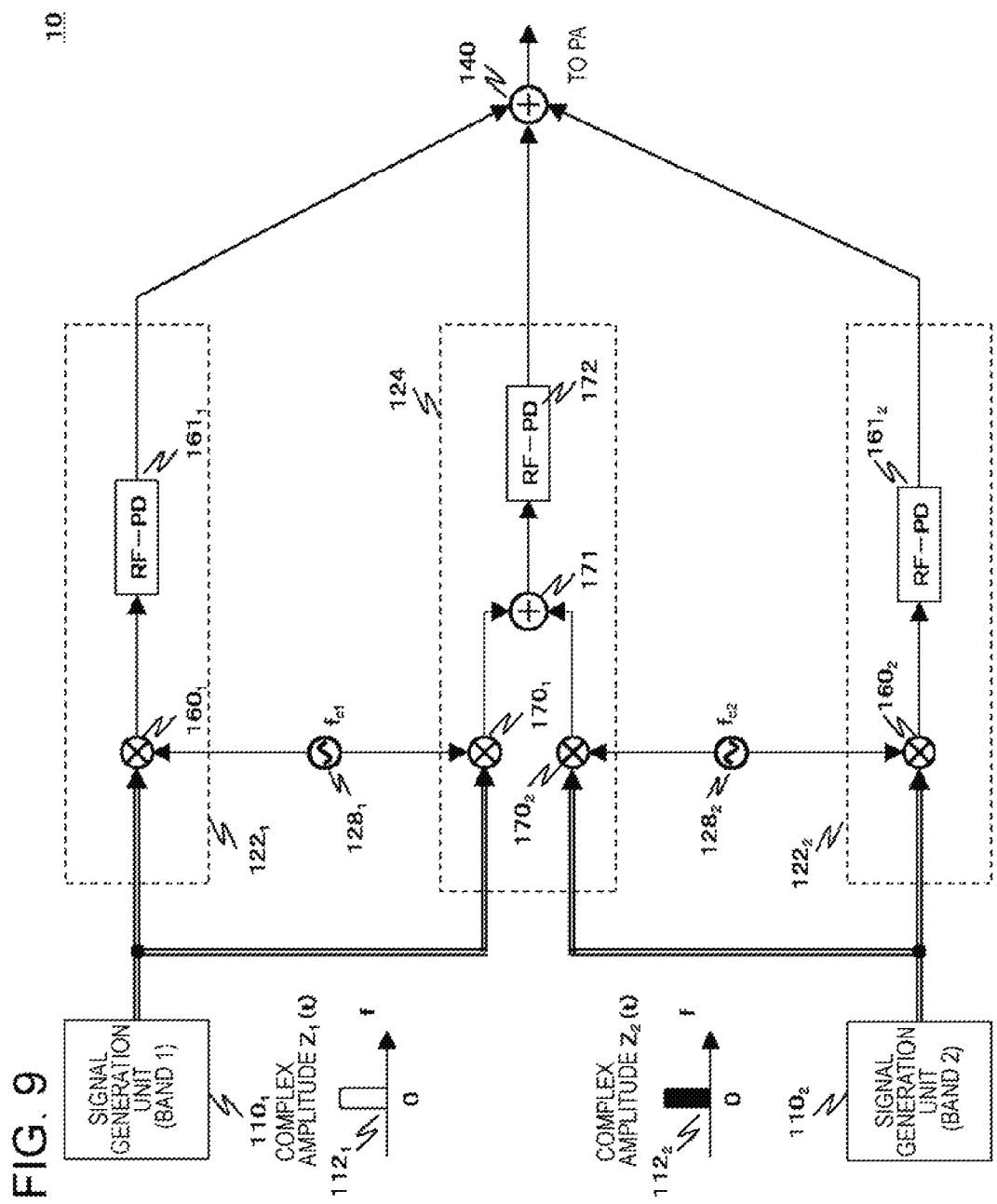
FIG. 9 is a block diagram illustrating a process configuration example of a signal transmission apparatus in a fifth exemplary embodiment of the present invention.

FIG. 9 is a block diagram illustrating a process configuration example of a signal transmission apparatus 10 in a fifth exemplary embodiment of the present invention. The signal transmission apparatus 10 in the fifth exemplary embodiment is obtained by replacing the in-band distortion compensation analog circuit $122_1$ and the in-band distortion compensation analog circuit $122_2$ with the same configuration as in the third exemplary embodiment, using the signal transmission apparatus 10 of the fourth exemplary embodiment as a base. That is, the in-band distortion compensation analog circuit $122_1$ and the in-band distortion compensation analog circuit $122_2$ shown in FIG. 9 have the same configurations as those of the in-band distortion compensation analog circuit $122_1$ and the in-band distortion compensation analog circuit $122_2$ in the third exemplary embodiment.

In addition, the in-band distortion compensation analog circuit $122_1$ and the in-band distortion compensation analog circuit $122_2$ shown in FIG. 9 perform the same operations as those of the in-band distortion compensation analog circuit $122_1$ and the in-band distortion compensation analog circuit $122_2$ in the fourth exemplary embodiment.

As described above, in the signal transmission apparatus 10 of the fifth exemplary embodiment, it is also possible to obtain the same effect as that of the first exemplary embodiment.

(Sixth Exemplary Embodiment)

Figure 10:
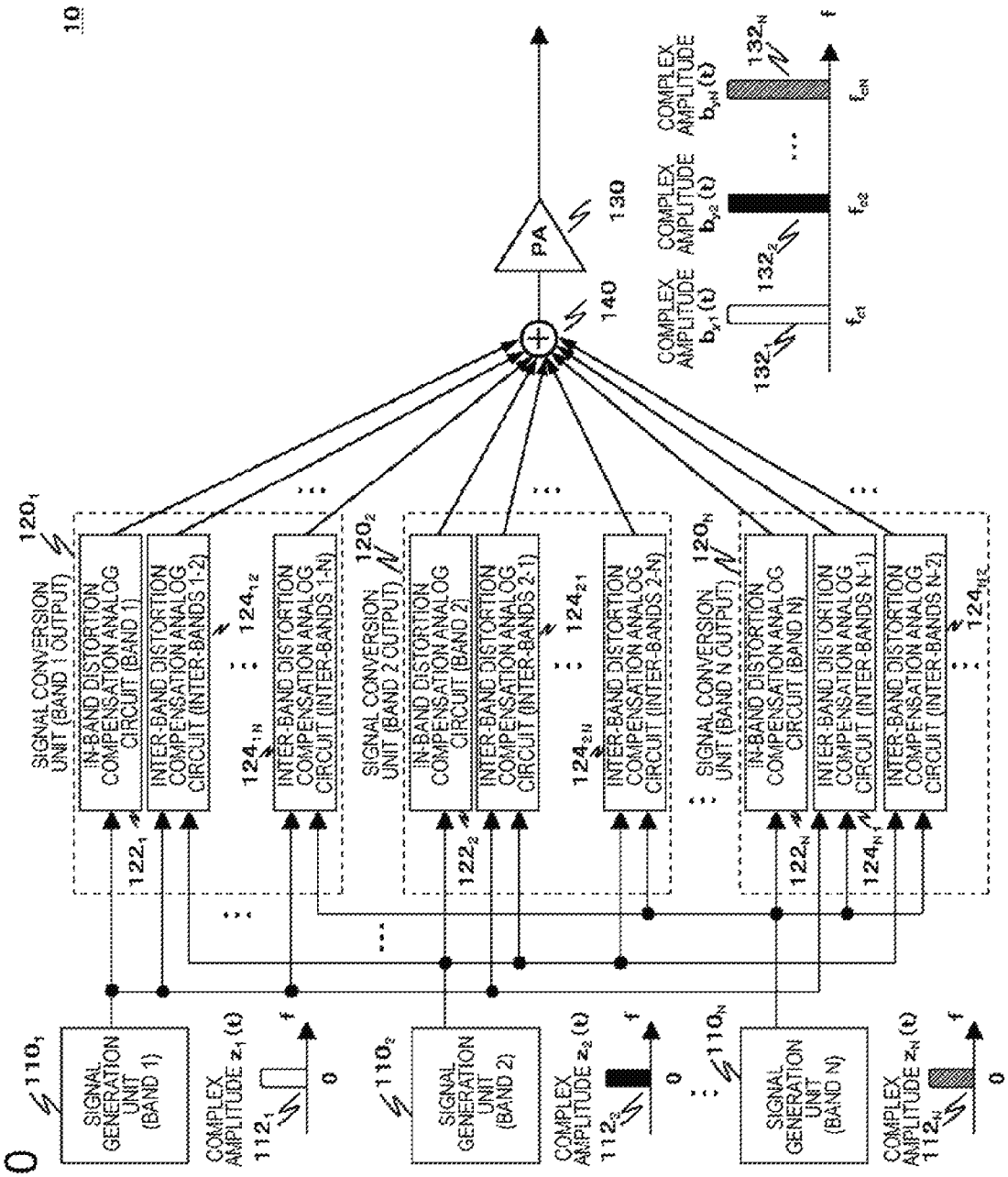
FIG. 10 is a block diagram illustrating a process configuration example of a signal transmission apparatus in a sixth exemplary embodiment of the present invention.

FIG. 10 is a block diagram illustrating a process configuration example of a signal transmission apparatus 10 in a sixth exemplary embodiment of the present invention. The signal transmission apparatus 10 in the sixth exemplary embodiment is obtained by expanding the signal transmission apparatus 10 in the first exemplary embodiment, and simultaneously transmits RF signals of N bands (N≥2).

The signal transmission apparatus 10 of FIG. 10 is configured to include at least the signal generation unit $110_1$ to a signal generation unit $110_N$, the signal conversion unit $120_1$ to a signal conversion unit $120_N$, the synthesizer 140, and the amplification unit 130.

The signal conversion unit $120_k$ (k=1, 2, . . . , N) causes signals for compensating for signal distortion generated in the amplification unit 130, that is, a signal for compensating for in-band intermodulation distortion occurring due to frequency mixing within a band k (carrier frequency $f_{ck}$) and a signal for compensating for cross-modulation distortion occurring due to frequency mixing between the band k and another band to be carried by an RF signal of the band k (carrier frequency $f_{ck}$), and outputs the RF signal to the synthesizer 140.

The signal conversion unit $120_k$ (k=1, 2, . . . , N) includes an in-band distortion compensation analog circuit $122_k$ and an inter-band distortion compensation analog circuit $124_{kj}$ (k, j=1, 2, . . . , N; k≠j).

An analog baseband signal $112_k$ corresponding to the band k is input to the in-band distortion compensation analog circuit $122_k$ (k=1, 2, . . . , N) from a signal generation unit $110_k$. The in-band distortion compensation analog circuit $122_k$ generates an in-band distortion compensation signal for compensating for in-band intermodulation distortion occurring due to frequency mixing within the band k (carrier frequency $f_{ck}$), among the signals for compensating for in-band modulation distortion of each band generated in the amplification unit 130. The in-band distortion compensation analog circuit $122_k$ causes the in-band distortion compensation signal to be carried by an RF signal of the band k (carrier frequency $f_{ck}$) and outputs the RF signal to the synthesizer 140.

The analog baseband signal $112_k$ which is output from the signal generation unit $110_k$ and an analog baseband signal $112_j$ which is output from a signal generation unit $110_j$ are input to the inter-band distortion compensation analog circuit $124_{kj}$ (k, j=1, 2, . . . , N; k≠j). The inter-band distortion compensation analog circuit $124_{kj}$ generates an inter-band distortion compensation signal for compensating for cross-modulation distortion occurring due to frequency mixing between the band k and a band j, among the signals for compensating for cross-modulation distortion generated in the amplification unit 130. The inter-band distortion compensation analog circuit $124_{kj}$ causes the inter-band distortion compensation signal to be carried by an RF signal of the band k (carrier frequency $f_{ck}$) and outputs the RF signal to the synthesizer 140.

Through the same operation as that of the signal conversion unit $120_k$ (k=1, 2) of the signal transmission apparatus 10 in the first exemplary embodiment, the signal conversion unit $120_k$ (k=1, 2, . . . , N) of the signal transmission apparatus 10 in the sixth exemplary embodiment can output a signal for compensating for in-band intermodulation distortion occurring due to frequency mixing within a single band and a signal for compensating for cross-modulation distortion occurring due to frequency mixing between a plurality of bands, using only an analog circuit. Thereby, even when the RF signals of a plurality of bands (band number N≥2) are collectively input to the amplification unit 130, the signal distortion of the amplification unit 130 is compensated for. As a result, according to the signal transmission apparatus 10 of the present exemplary embodiment, the RF signals $132_1$ of the band 1 to $132_N$ of the band N can be output from the amplification unit 130 in a state where the signal distortion is suppressed.

Meanwhile, in the signal transmission apparatus shown in FIG. 10, similarly to the modification example of the first exemplary embodiment, the inter-band distortion compensation analog circuit $124_{kj}$ and an inter-band distortion compensation analog circuit $124_{jk}$ (k, j=1, 2, . . . , N; k≠j) having the same combination of bands may be integrated as one inter-band distortion compensation analog circuit 124.

In addition, in the signal transmission apparatus 10 shown in FIG. 10, the in-band distortion compensation analog circuit $122_k$ (k=1, 2, . . . , N) can be implemented similarly to the in-band distortion compensation analog circuit 122 of the second to fifth exemplary embodiments.

In addition, in the signal transmission apparatus 10 shown in FIG. 10, the inter-band distortion compensation analog circuit $124_{kj}$ (k, j=1, 2, . . . , N; k≠j) can be implemented similarly to the inter-band distortion compensation analog circuit 124 of the second to fifth exemplary embodiments.

(Seventh Exemplary Embodiment)

Figure 11:
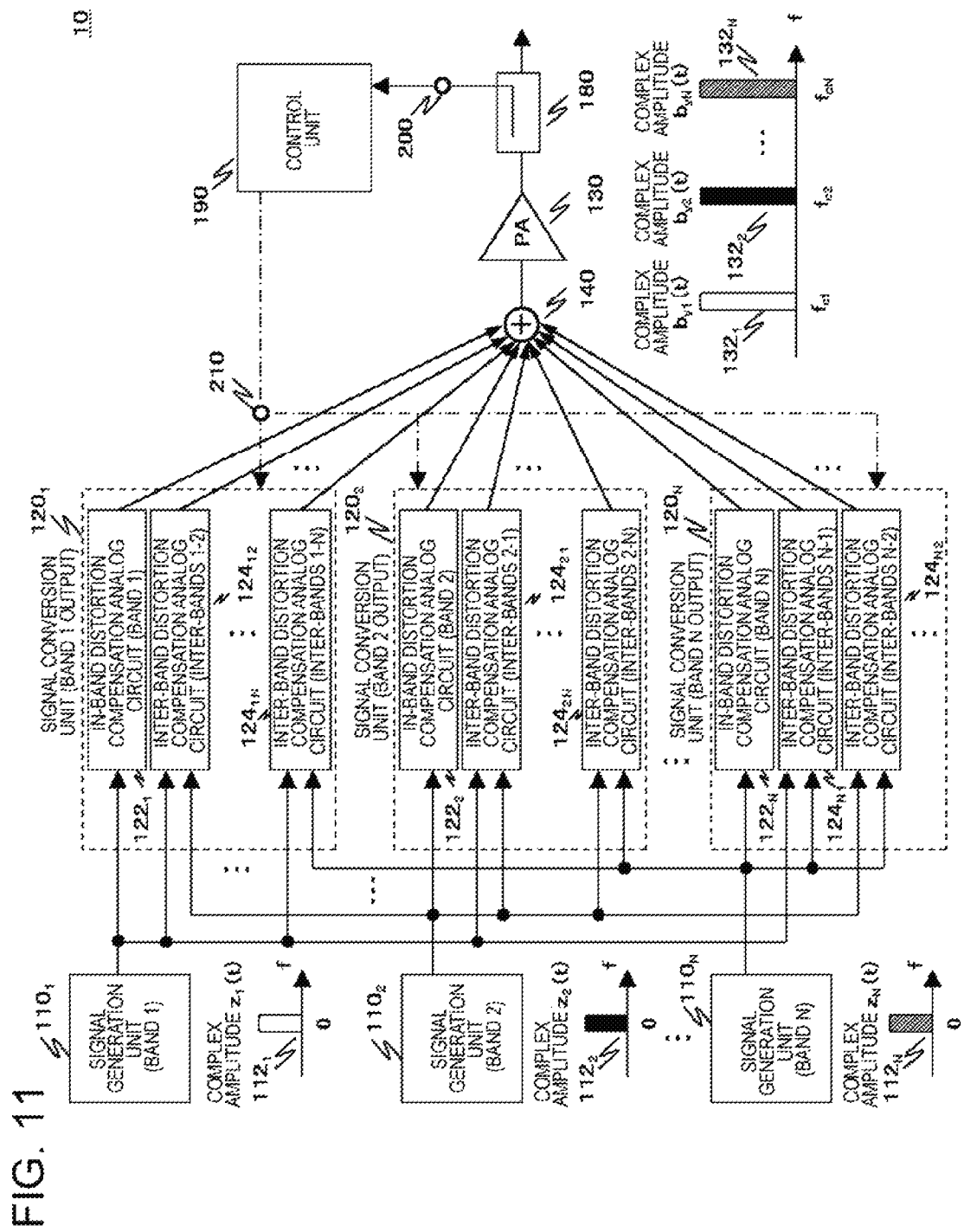
FIG. 11 is a block diagram illustrating a process configuration example of a signal transmission apparatus in a seventh exemplary embodiment of the present invention.

FIG. 11 is a block diagram illustrating a process configuration example of a signal transmission apparatus 10 in a seventh exemplary embodiment of the present invention. A coupler 180 and a control unit 190 are added to the signal transmission apparatus 10 in the seventh exemplary embodiment, using the signal transmission apparatus 10 shown in FIG. 10 as a base. Elements other than the coupler 180 and the control unit 190 are common between the sixth exemplary embodiment and the seventh exemplary embodiment.

The coupler 180 detects the RF signals $132_1$ of the band 1 to $132_N$ of the band N which are output from the amplification unit 130, and transmits the detected signals to the control unit 190 through an input terminal 200. The coupler 180 can also be called a signal detection unit. Meanwhile, although not particularly limited, the insertion loss of the coupler 180 is preferably low.

The control unit 190 detects signal distortion of each of the RF signals $132_1$ of the band 1 to $132_N$ of the band N, based on the detection signals detected by the coupler 180. An example of signal distortion to be detected includes signal distortion represented by a spectrum, particularly, adjacent channel leakage power (Adjacent Channel Power Ratio (ACPR)), or the like.

Further, the control unit 190 transmits a signal for controlling the characteristics of the signal conversion unit $120_k$ (k=1, 2, . . . , N) through the output terminal 210 so as to minimize the detected signal distortion of the RF signals $132_1$ of the band 1 to $132_N$ of the band N. Here, the characteristics of the signal conversion unit $120_k$ indicate the amplitude and phase of an in-band distortion compensation signal $q_{(k)3}|z_k(t)|^2 z_k(t)$ (that is, amplitude and phase of a complex coefficient $q_{(k)3}$) which is output from the in-band distortion compensation analog circuit $122_k$ and the amplitude and phase of an inter-band distortion compensation signal $r_{(k)3}|z_1(t)|^2 z_k(t)$ (that is, amplitude and phase of a complex coefficient $r_{(k)3}$) which is output from the inter-band distortion compensation analog circuit $124_{kj}$ (k, j=1, 2, . . . , N; k≠j).

As described in the second to fifth exemplary embodiments, the coefficients $q_{(k)3}$ and $r_{(k)3}$ indicating the characteristics of the signal conversion unit $120_k$ can be changed and set by controlling the circuit parameters of the baseband amplitude and phase corrector 1223, 1224, and 1027, or the RF-PD 161 and the RF-PD 172. Therefore, the control unit 190 controls the characteristics of the signal conversion unit $120_k$ by controlling circuit parameters of the baseband amplitude and phase corrector 1223, 1224, and 1027 (specifically, G and θ which are control parameters of signals output by the signal generator 1043 and the signal generator 1044 in FIG. 4). Alternatively, the control unit 190 controls the characteristics of the signal conversion unit $120_k$ by controlling the circuit parameters of the RF-PD 161 and the RF-PD 172 (specifically, impedance $Z_{BB}$ of the phase adjustment circuit 82 and impedance $Z_{RF}$ of the amplitude adjustment circuit 83 in FIG. 7).

Figure 12:
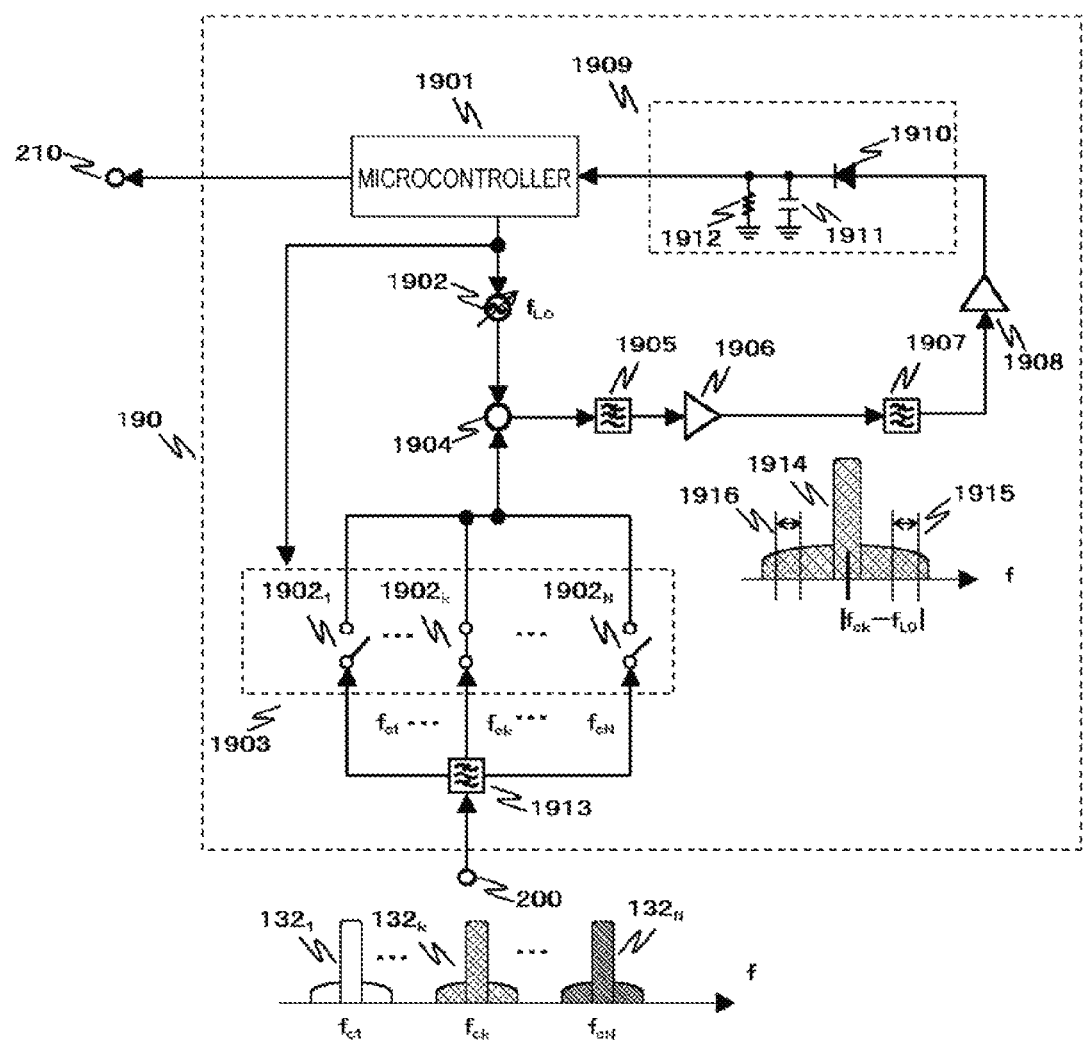
FIG. 12 is a block diagram illustrating an example of an internal configuration of a control unit.

FIG. 12 is a block diagram illustrating an example of the internal configuration of the control unit 190. The control unit 190 shown in FIG. 12 includes a microcontroller 1901, a variable LO signal generator 1902, a switch 1903, a mixer 1904, a low-pass filter 1905, an amplifier 1906, a bandpass filter 1907, a logarithmic amplifier 1908, a detector 1909, and a demultiplexer 1913.

The switch 1903 includes switch elements $1903_1$ to $1903_N$ of the same number (N) as the number of bands which are transmitted by the signal transmission apparatus of FIG. 11.

The demultiplexer 1913 separates the RF signals $132_1$ of the band 1 to $132_N$ of the band N which are input from the coupler 180 through the input terminal 200 for each band. The RF signals $132_1$ of the band 1 to $132_N$ of the band N are respectively supplied to the switch elements $1903_1$ to $1903_N$ which are different from each other. That is, an RF signal $132_k$ (k=1, 2, . . . , N) is input to a switch element $1913_k$.

The microcontroller 1901 selects one of the switch elements $1903_1$ to $1903_N$ and sets the selected one to be in an on-state. That is, the RF signal of one band out of the band 1 to the band N is supplied to the mixer 1904 through the switch 1903. Meanwhile, FIG. 11 shows a state where the RF signal $132_k$ of the band k is selected and is supplied to the mixer 1904. The RF signal which is supplied to the mixer 1904 can be appropriately switched in accordance with a final output of the control unit 190. Specifically, when a signal for controlling the characteristics of the signal conversion unit $120_1$ is output, the microcontroller 1901 controls the on/off state of the switch 1903 so that the RF signal $132_1$ of the band 1 is selected.

The variable LO signal generator 1902 outputs the LO signal of a frequency $f_{LO}$ to the mixer 1904. The mixer 1904 converts the RF signal $132_k$ of the band k (carrier frequency $f_{ck}$) which is input to the mixer 1904 into an intermediate frequency (IF) signal of a carrier frequency $|f_{ck}-f_{LO}|$, and outputs the result to the amplifier 1906 through the low-pass filter 1905. Meanwhile, the mixer 1904 also outputs an image signal of a carrier frequency $f_{ck}+f_{LO}$, but this image signal is cut off by the low-pass filter 1905.

The IF signal which is output from the mixer 1904 is amplified as an IF signal 1914 by the amplifier 1906 as shown in FIG. 11. The bandpass filter 1907 passes a signal component of either a passband 1915 or a passband 1916 corresponding to an adjacent channel of the IF signal 1914. The passband 1915 or the passband 1916 corresponding to the adjacent channel of the IF signal 1914 is determined by a communication standard. For example, in a case of WCDMA (Registered Trademark), the center frequency of the passband 1915 and the passband 1916 is set to ±5 MHz from the center frequency of the IF signal 1914, and the passband width thereof is set to 3.84 MHz.

From the above, the center frequency of the passband 1915 and the passband 1916 is represented by $|f_{ck}-f_{LO}|+f_{spec}$. Here, the frequency $f_{spec}$ is a value which is determined by a communication standard, and is ±5 MHz in a case of WCDMA (Registered Trademark).

The center frequency $f_{BPF}$ of the bandpass filter 1907 is typically a fixed value. For this reason, the frequency $f_{LO}$ of the LO signal which is output from the variable LO signal generator 1902 is set so that the center frequency $f_{BPF}$ of the bandpass filter 1907 is coincident with the center frequency $|f_{ck}-f_{LO}|+f_{spec}$ of the passband 1915 and the passband 1916. The frequency $f_{LO}$ of the LO signal which is output from the variable LO signal generator 1902 can be changed, and the setting of the frequency $f_{LO}$ is performed through the microcontroller 1901. Particularly, when the microcontroller 1901 switches the switch 1903 and switches the RF signal 132 which is input to the mixer 1904, the frequency $f_{LO}$ of the LO signal which is output from the variable LO signal generator 1902 is also changed together in association with a change in the carrier frequency of the RF signal 132 which is input to the mixer 1904.

The signal component of the passband 1915 or the passband 1916 corresponding to the adjacent channel which is extracted by the bandpass filter 1907 is input to the logarithmic amplifier 1908. The logarithmic amplifier 1908 is logarithmically scales the input signal component and outputs the result to the detector 1909.

The detector 1909 is configured to include a diode 1910, a capacitive element 1911, and a resistive element 1912. The detector 1909 down-converts the output signal of the logarithmic amplifier 1908 from an IF band to a baseband, and outputs the result to the microcontroller 1901. The microcontroller 1901 detects ACPR of the RF signal $132_k$ (that is, signal distortion component of either the passband 1915 or the passband 1916 corresponding to the adjacent channel of the IF signal 1914) through the above-mentioned configuration. In addition, the microcontroller 1901 can also detect signal components of both the passband 1915 and the passband 1916 by switching the frequency $f_{LO}$ of the LO signal.

In the switch 1903, a band of the RF signal 132 is switched, the setting of the frequency $f_{LO}$ of the LO signal which is output from the variable LO signal generator 1902 is switched in accordance with the carrier frequency of the band, and a measurement procedure of the above signal distortion (particularly, ACPR) is repeated, thereby allowing all the signal distortions (particularly, ACPR) of the RF signals 132₁ of the band 1 to 132_N of the band N to be measured.

As previously described, the control unit 190 transmits a signal for controlling the characteristics of the signal conversion unit 120_k (k=1, 2, . . . , N) through the output terminal 210. The control unit 190 repeats the characteristics control of the signal conversion unit 120_k and the measurement of the signal distortions of the RF signals 132₁ of the band 1 to 132_N of the band N, and thus can search for and set the characteristics of the signal conversion unit 120_k for minimizing the signal distortions of the RF signals 132₁ of the band 1 to 132_N of the band N.

Meanwhile, the characteristics control of the signal conversion unit 120_k and the measurement of the signal distortions of the RF signals 132₁ of the band 1 to 132_N of the band N are not required to be performed at high speed, and may be performed, for example, every several seconds or so.

Each modulation bandwidth of the RF signals 132₁ of the band 1 to 132_N of the band N is dependent on a communication standard, but is typically several kHz to several tens MHz. Parameters which are controlled by the signal conversion unit 120_k (specifically, G and θ which are control parameters of the signal generator 1043 and the signal generator 1044 in FIG. 4, and impedance $Z_{BB}$ of the phase adjustment circuit 82 and impedance $Z_{RF}$ of the amplitude adjustment circuit 83 in FIG. 7) are changed typically at sufficiently slower speed than the time scale (several microseconds to several milliseconds) of the modulation bandwidth. In addition, the ACPR of the RF signals 132₁ of the band 1 to 132_N of the band N is measured typically over sufficiently longer time than the time scale (several microseconds to several milliseconds) of the modulation bandwidth. Therefore, the microcontroller 1901 may cope with low-speed control without performing a high-speed arithmetic operation or control.

From the above, in the present exemplary embodiment, it is also possible to obtain the same effect as that of the first exemplary embodiment.

In addition, in the present exemplary embodiment, an RF signal which is actually output from the amplification unit 130 by the coupler 180 is detected, and the characteristics of each signal conversion unit 120 are controlled based on the detected RF signal. Thereby, according to the present exemplary embodiment, signal distortion included in the RF signal which is output from the amplification unit 130 can be suppressed with a higher degree of accuracy.

In addition, when the signal conversion unit 120 is controlled using the control unit 190, the control thereof is performed at a sufficiently longer time scale than the modulation bandwidth, and thus the operation of a distortion correction analog circuit is not restricted by the modulation bandwidth of a transmission signal. Therefore, the configuration of the present exemplary embodiment can be adopted without any difficulty even in high-speed communication.

As described above, the configurations of the respective preferred exemplary embodiments of the present invention has been described. However, they are merely illustrative of the present invention, and various configurations other than those stated above can also be adopted. In addition, the respective exemplary embodiments described above can be combined in the range consistent with the contents thereof. In addition, the respective exemplary embodiments described above include various modification examples that can be made by those skilled in the art based on the basic technical ideas.

Hereinafter, examples of reference forms are appended.

1. A signal transmission apparatus including:

a signal generation unit that outputs a plurality of analog baseband signals corresponding to each band;

a signal conversion unit that converts the plurality of (n) output analog baseband signals into radio frequency (RF) signals of corresponding bands; and an amplification unit that collectively amplifies the RF signals converted for each band, wherein the signal conversion unit includes an in-band distortion compensation analog circuit unit that generates, for each band, an in-band distortion compensation signal for compensating for in-band intermodulation distortion occurring due to frequency mixing of RF signals of a single band, the distortion being included in the RF signals which are output from the amplification unit, and causes the generated signal to be carried by the RF signals corresponding to the single band, and an inter-band distortion compensation analog circuit unit that generates, for each combination of two bands, an inter-band distortion compensation signal for compensating for cross-modulation distortion occurring due to frequency mixing of RF signals between a plurality of bands which are input to the amplification unit, and causes the generated signal to be carried by each of the RF signals corresponding to the two bands.

2. The signal transmission apparatus according to 1, wherein the in-band distortion compensation analog circuit unit generates the in-band distortion compensation signal using parameters based on the in-band intermodulation distortion occurring by mixing RF signals of a single band in the amplification unit, and the inter-band distortion compensation analog circuit unit generates the inter-band distortion compensation signal using parameters based on the cross-modulation distortion occurring by mixing RF signals of two bands different from each other in the amplification unit.

3. The signal transmission apparatus according to 2, wherein the inter-band distortion compensation analog circuit unit includes:

a first multiplication unit that multiplies a first analog baseband signal, which is one baseband signal of two analog baseband signals which are input to the inter-band distortion compensation analog circuit unit, by an amplitude square value of a second analog baseband signal which is the other analog baseband signal;

a second multiplication unit that multiplies the second analog baseband signal by an amplitude square value of the first analog baseband signal;

a compensation signal generation unit that generates the inter-band distortion compensation signal by correcting an amplitude and a phase of each analog baseband signal which is obtained by the multiplication, using the parameters based on the cross-modulation distortion of the amplification unit; and a plurality of quadrature transformation units that transform each analog baseband signal provided with the inter-band distortion compensation signal into an RF signal of each corresponding band.

4. The signal transmission apparatus according to 1, wherein the inter-band distortion compensation analog circuit unit generates the inter-band distortion compensation signal using parameters based on cross-modulation distortion occurring by mixing RF signals of two bands different from each other in the amplification unit, and the in-band distortion compensation analog circuit unit generates the in-band distortion compensation signal using parameters based on in-band intermodulation distortion occurring by mixing RF signals of a single band in the amplification unit and in-band intermodulation distortion occurring in a process of generating the inter-band distortion compensation signal in the inter-band distortion compensation analog circuit unit.

5. The signal transmission apparatus according to 4, wherein the inter-band distortion compensation analog circuit unit includes:

a plurality of quadrature modulation units that convert two analog baseband signals which are input to the inter-band distortion compensation analog circuit unit into RF signals of each corresponding band; and a compensation signal generation unit that generates the inter-band distortion compensation signal by correcting an amplitude and a phase of the converted RF signal using the parameters based on cross-modulation distortion of the amplification unit.

6. The signal transmission apparatus according to any one of 1 to 5, further including a control unit that controls the signal conversion unit, wherein the control unit includes:

a signal detection unit that detects an RF signal which is output from the amplification unit; and a distortion detection unit that detects a signal distortion component included in the detected RF signal, the control unit providing the in-band distortion compensation analog circuit unit with parameters used in generating the in-band distortion compensation signal and providing the inter-band distortion compensation analog circuit unit with parameters used in generating the inter-band distortion compensation signal, based on the detected signal distortion component.

7. The signal transmission apparatus according to 6, wherein the distortion detection unit includes:

a demultiplexing unit that demultiplexes, for each band, the RF signal detected in the signal detection unit;

a selection unit that selects one RF signal out of the RF signals demultiplexed into each band;

a variable LO signal generation unit that outputs a local oscillation (LO) signal;

a microcontroller that controls a selected destination of the selection unit, and a frequency of the LO signal which is output from the variable LO signal generation unit based on a carrier frequency of the RF signal selected by the selection unit;

a mixer unit that mixes the selected RF signal with the LO signal to generate an intermediate frequency (IF) signal;

a filtering unit that removes a signal other than the IF signal and then passes only a signal distortion component of a frequency band corresponding to signal distortion included in the IF signal; and a wave detection unit that down-converts the signal distortion component from an IF band to a baseband range, and wherein the control unit provides the in-band distortion compensation analog circuit unit with the parameters used in generating the in-band distortion compensation signal and provides the inter-band distortion compensation analog circuit unit with the parameters used in generating the inter-band distortion compensation signal, based on the signal distortion component for each band which is detected in the distortion detection unit.

8. A distortion compensation apparatus that compensates for in-band intermodulation distortion for each band and cross-modulation distortion between a plurality of bands, included in RF signals which are output from an amplification unit that collectively amplifies radio frequency (RF) signals of a plurality of bands, the apparatus comprising:

an in-band distortion compensation analog circuit unit that generates, for each band, an in-band distortion compensation signal for compensating for in-band intermodulation distortion occurring due to frequency mixing of RF signals of a single band, the distortion being included in the RF signals which are output from the amplification unit, and causes the generated signal to be carried by the RF signals corresponding to the single band; and an inter-band distortion compensation analog circuit unit that generates, for each combination of two bands, an inter-band distortion compensation signal for compensating for cross-modulation distortion occurring due to frequency mixing of RF signals between a plurality of bands which are input to the amplification unit, and causes the generated signal to be carried by each of the RF signals corresponding to the two bands.

9. The distortion compensation apparatus according to 8, wherein the in-band distortion compensation analog circuit unit generates the in-band distortion compensation signal using parameters based on the in-band intermodulation distortion occurring by mixing RF signals of a single band in the amplification unit, and the inter-band distortion compensation analog circuit unit generates the inter-band distortion compensation signal using parameters based on the cross-modulation distortion occurring by mixing RF signals of two bands different from each other in the amplification unit.

10. The distortion compensation apparatus according to 9, wherein the inter-band distortion compensation analog circuit unit includes:

a first multiplication unit that multiplies a first analog baseband signal, which is one baseband signal of two analog baseband signals which are input to the inter-band distortion compensation analog circuit unit, by an amplitude square value of a second analog baseband signal which is the other analog baseband signal;

a second multiplication unit that multiplies the second analog baseband signal by an amplitude square value of the first analog baseband signal;

a compensation signal generation unit that generates the inter-band distortion compensation signal by correcting an amplitude and a phase of each analog baseband signal which is obtained by the multiplication, using the parameters based on the cross-modulation distortion of the amplification unit; and a plurality of quadrature transformation units that transform each analog baseband signal provided with the inter-band distortion compensation signal into an RF signal of each corresponding band.

11. The distortion compensation apparatus according to 8, wherein the inter-band distortion compensation analog circuit unit generates the inter-band distortion compensation signal using parameters based on cross-modulation distortion occurring by mixing RF signals of two bands different from each other in the amplification unit, and the in-band distortion compensation analog circuit unit generates the in-band distortion compensation signal using parameters based on in-band intermodulation distortion occurring by mixing RF signals of a single band in the amplification unit and in-band intermodulation distortion occurring in a process of generating the inter-band distortion compensation signal in the inter-band distortion compensation analog circuit unit.

12. The distortion compensation apparatus according to 11, wherein the inter-band distortion compensation analog circuit unit includes:
a plurality of quadrature modulation units that convert two analog baseband signals which are input to the inter-band distortion compensation analog circuit unit into RF signals of each corresponding band; and
a compensation signal generation unit that generates the inter-band distortion compensation signal by correcting an amplitude and a phase of the converted RF signal using the parameters based on cross-modulation distortion of the amplification unit.

13. The distortion compensation apparatus according to any one of 8 to 12, further including a control unit that controls the signal conversion unit,
wherein the control unit includes:
a signal detection unit that detects an RF signal which is output from the amplification unit; and
a distortion detection unit that detects a signal distortion component included in the detected RF signal,
the control unit providing the in-band distortion compensation analog circuit unit with parameters used in generating the in-band distortion compensation signal and providing the inter-band distortion compensation analog circuit unit with parameters used in generating the inter-band distortion compensation signal, based on the detected signal distortion component.

14. The distortion compensation apparatus according to 13, wherein the distortion detection unit includes:
a demultiplexing unit that demultiplexes, for each band, the RF signal detected in the signal detection unit;
a selection unit that selects one RF signal out of the RF signals demultiplexed into each band;
a variable LO signal generation unit that outputs a local oscillation (LO) signal;
a microcontroller that controls a selected destination of the selection unit, and a frequency of the LO signal which is output from the variable LO signal generation unit based on a carrier frequency of the RF signal selected by the selection unit;
a mixer unit that mixes the selected RF signal with the LO signal to generate an intermediate frequency (IF) signal;
a filtering unit that removes a signal other than the IF signal and then passes only a signal distortion component of a frequency band corresponding to signal distortion included in the IF signal; and
a wave detection unit that down-converts the signal distortion component from an IF band to a baseband range, and
wherein the control unit provides the in-band distortion compensation analog circuit unit with the parameters used in generating the in-band distortion compensation signal and provides the inter-band distortion compensation analog circuit unit with the parameters used in generating the inter-band distortion compensation signal, based on the signal distortion component for each band which is detected in the distortion detection unit.

15. A signal transmission method performed by a signal transmission apparatus including an amplification unit that collectively amplifies radio frequency (RF) signals of a plurality of bands, the method including the steps performed by the signal transmission apparatus of:
outputting a plurality of analog baseband signals corresponding to each band in a signal generation unit;
converting the plurality of output analog baseband signals into radio frequency (RF) signals of corresponding bands in a signal conversion unit;
generating, for each band, an in-band distortion compensation signal for compensating for in-band intermodulation distortion occurring due to frequency mixing of RF signals of a single band, the distortion being included in the RF signals which are output from the amplification unit, and causing the generated signal to be carried by the RF signals corresponding to the single band, in an in-band distortion compensation analog circuit unit;
generating, for each combination of two bands, an inter-band distortion compensation signal for compensating for cross-modulation distortion occurring due to frequency mixing of RF signals between a plurality of bands which are input to the amplification unit, and causing the generated signal to be carried by each of the RF signals corresponding to the two bands, in an inter-band distortion compensation analog circuit unit; and
collectively amplifying and transmitting RF signals of a plurality of bands including the in-band distortion compensation signal and the inter-band distortion compensation signal, in the amplification unit.

16. The signal transmission method performed by the signal transmission apparatus according to 15, further including the steps of:
generating the in-band distortion compensation signal using parameters based on the in-band intermodulation distortion occurring by mixing RF signals of a single band in the amplification unit, in the in-band distortion compensation analog circuit unit; and
generating the inter-band distortion compensation signal using parameters based on the cross-modulation distortion occurring by mixing RF signals of two bands different from each other in the amplification unit, in the inter-band distortion compensation analog circuit unit.

17. The signal transmission method performed by the signal transmission apparatus according to 16, the method further including the steps, performed in the inter-band distortion compensation analog circuit unit, of:
multiplying a first analog baseband signal, which is one baseband signal of two analog baseband signals which are input to the inter-band distortion compensation analog circuit unit, by an amplitude square value of a second analog baseband signal which is the other analog baseband signal;
multiplying the second analog baseband signal by an amplitude square value of the first analog baseband signal;
generating the inter-band distortion compensation signal by correcting an amplitude and a phase of each analog baseband signal which is obtained by the multiplication, using the parameters based on the cross-modulation distortion of the amplification unit; and
transforming each analog baseband signal provided with the inter-band distortion compensation signal into an RF signal of each corresponding band.

18. The signal transmission method performed by the signal transmission apparatus according to 15, the method further including the steps of:
generating the inter-band distortion compensation signal using parameters based on cross-modulation distortion occurring by mixing RF signals of two bands different from each other in the amplification unit, in the inter-band distortion compensation analog circuit unit; and
generating the in-band distortion compensation signal using parameters based on in-band intermodulation distortion occurring by mixing RF signals of a single band in the amplification unit and in-band intermodulation distortion occurring in a process of generating the inter-band distortion compensation signal in the inter-band distortion compensation analog circuit unit, in the in-band distortion compensation analog circuit unit.

19. The signal transmission method performed by the signal transmission apparatus according to 18, the method further including the steps, performed in the inter-band distortion compensation analog circuit unit, of:
converting two analog baseband signals which are input to the inter-band distortion compensation analog circuit unit into RF signals of each corresponding band; and
generating the inter-band distortion compensation signal by correcting an amplitude and a phase of the converted RF signal using the parameters based on cross-modulation distortion of the amplification unit.

20. The signal transmission method according to any one of 15 to 19, wherein the signal transmission apparatus further includes a control unit that controls the signal conversion unit,
the control unit performing the steps of:
detecting an RF signal which is output from the amplification unit, in a signal detection unit;
detecting a signal distortion component included in the detected RF signal, in a distortion detection unit; and
providing the in-band distortion compensation analog circuit unit with parameters used in generating the in-band distortion compensation signal and providing the inter-band distortion compensation analog circuit unit with parameters used in generating the inter-band distortion compensation signal, based on the detected signal distortion component.

21. The signal transmission method according to 20, the distortion detection unit performing the steps of:
demultiplexing the RF signal detected in the signal detection unit for each band;
selecting one RF signal out of the RF signals demultiplexed into each band;
controlling a selected destination of the selection unit, and a frequency of a LO signal which is output from a variable LO signal generation unit based on a carrier frequency of the RF signal selected by the selection unit;
mixing the selected RF signal with the LO signal to generate an intermediate frequency (IF) signal;
removing a signal other than the IF signal and then passing only a signal distortion component of a frequency band corresponding to signal distortion included in the IF signal; and
down-converting the signal distortion component from an IF band to a baseband range, and
the control unit performing the step of providing the in-band distortion compensation analog circuit unit with the parameters used in generating the in-band distortion compensation signal and providing the inter-band distortion compensation analog circuit unit with the parameters used in generating the inter-band distortion compensation signal, based on the signal distortion component for each band which is detected in the distortion detection unit.

The application claims priority from Japanese Application No. 2013-199395 filed on Sep. 26, 2013, the content of which is incorporated herein by reference in its entirety.

The invention claimed is:

1. A signal transmission apparatus comprising:
a signal generation unit that outputs a plurality of analog baseband signals such that each of the plurality of analog baseband signals corresponds to a respective band from among a plurality of bands;
a signal conversion unit that converts each of the plurality of output analog baseband signals into a respective radio frequency (RF) signal of the corresponding band; and
an amplification unit that collectively amplifies each converted RF signal,
wherein the signal conversion unit includes
an in-band distortion compensation analog circuit unit that generates, for each respective band, an in-band distortion compensation signal for compensating for in-band intermodulation distortion occurring due to frequency mixing of RF signals of the respective band, the distortion being included in each respective RF signal which is output from the amplification unit, and causes the respective generated in-band distortion compensation signal to be carried by the RF signals corresponding to the respective band, and
an inter-band distortion compensation analog circuit unit that generates, for each respective pair of bands from among the plurality of bands, an inter-band distortion compensation signal for compensating for cross-modulation distortion occurring due to frequency mixing of RF signals among the plurality of bands which are input to the amplification unit, and causes the respective generated inter-band distortion compensation signal to be carried by each respective RF signal that corresponds to one of the respective pair of bands.

2. The signal transmission apparatus according to claim 1, wherein for each respective band, the in-band distortion compensation analog circuit unit generates the corresponding in-band distortion compensation signal by using parameters based on the in-band intermodulation distortion occurring due to the mixing of the RF signals of the respective band in the amplification unit, and
for each respective pair of bands from among the plurality of bands, the inter-band distortion compensation analog circuit unit generates the respective inter-band distortion compensation signal by using parameters based on the cross-modulation distortion occurring due to the mixing of the RF signals among the plurality of bands in the amplification unit.

3. The signal transmission apparatus according to claim 2, wherein the inter-band distortion compensation analog circuit unit includes:
a first multiplication unit that multiplies a first analog baseband signal from among the plurality of analog baseband signals by an amplitude square value of a second analog baseband signal from among the plurality of analog baseband signals;
a second multiplication unit that multiplies the second analog baseband signal by an amplitude square value of the first analog baseband signal;
a compensation signal generation unit that generates the respective inter-band distortion compensation signal by correcting an amplitude and a phase of each respective analog baseband signal which is outputted by one of the first multiplication unit and the second multiplication unit, using the parameters based on the cross-modulation distortion; and
at least one quadrature transformation unit that transforms each respective analog baseband signal provided with the corresponding inter-band distortion compensation signal into a respective RF signal of the corresponding band.

4. The signal transmission apparatus according to claim 1, wherein for each respective pair of bands from among the plurality of bands, the inter-band distortion compensation analog circuit unit generates the corresponding inter-band distortion compensation signal by using parameters based on cross-modulation distortion occurring due to the mixing of the RF signals among the plurality of bands in the amplification unit, and for each respective band, the in-band distortion compensation analog circuit unit generates the corresponding in-band distortion compensation signal by using parameters based on the in-band intermodulation distortion occurring due to the mixing of the RF signals of the respective band in the amplification unit and in-band intermodulation distortion occurring in a process of generating the corresponding inter-band distortion compensation signal in the inter-band distortion compensation analog circuit unit.

5. The signal transmission apparatus according to claim 4, wherein the inter-band distortion compensation analog circuit unit includes:

at least one quadrature modulation unit that converts each analog baseband signal which is input to the inter-band distortion compensation analog circuit unit into a respective RF signal of the corresponding band; and a compensation signal generation unit that generates the inter-band distortion compensation signal by correcting an amplitude and a phase of the respective converted RF signal by using the parameters based on the cross-modulation distortion.

6. The signal transmission apparatus according to claim 1, further comprising a control unit that controls the signal conversion unit, wherein the control unit includes:

a signal detection unit that detects an RF signal which is output from the amplification unit; and a distortion detection unit that detects a signal distortion component included in the detected RF signal, wherein the control unit provides the in-band distortion compensation analog circuit unit with parameters used for generating the corresponding in-band distortion compensation signal and provides the inter-band distortion compensation analog circuit unit with parameters used for generating the corresponding inter-band distortion compensation signal, based on the detected signal distortion component.

7. The signal transmission apparatus according to claim 6, wherein the distortion detection unit includes:

a demultiplexing unit that demultiplexes, for each respective band, at least one RF signal detected by the signal detection unit;

a selection unit that selects one RF signal from among the at least one RF signal demultiplexed by the demultiplexing unit;

a variable local oscillation (LO) signal generation unit that outputs a LO signal;

a microcontroller that controls a frequency of the LO signal which is output from the variable LO signal generation unit based on a carrier frequency of the RF signal selected by the selection unit;

a mixer unit that mixes the selected RF signal with the LO signal to generate an intermediate frequency (IF) signal;

a filtering unit that filters noise from the IF signal and then passes only a signal distortion component of a frequency band corresponding to signal distortion included in the IF signal; and a wave detection unit that down-converts a frequency of the signal distortion component to a baseband range, and wherein the control unit provides the in-band distortion compensation analog circuit unit with the parameters used for generating the corresponding in-band distortion compensation signal and provides the inter-band distortion compensation analog circuit unit with the parameters used for generating the corresponding inter-band distortion compensation signal, based on the signal distortion component detected by the distortion detection unit.

8. A distortion compensation apparatus that compensates for in-band intermodulation distortion in each of a plurality of bands and cross-modulation distortion between respective pairs of bands from among the plurality of bands, the in-band intermodulation distortion and the cross-modulation distortion being included in RF signals which are output from an amplification unit that collectively amplifies radio frequency (RF) signals, the apparatus comprising:

an in-band distortion compensation analog circuit unit that generates, for each respective band, an in-band distortion compensation signal for compensating for in-band intermodulation distortion occurring due to frequency mixing of RF signals of the respective band, the distortion being included in each respective RF signal which is output from the amplification unit, and causes the respective generated in-band distortion compensation signal to be carried by the RF signals corresponding to the respective band; and an inter-band distortion compensation analog circuit unit that generates, for each respective pair of bands from among the plurality of bands, an inter-band distortion compensation signal for compensating for cross-modulation distortion occurring due to frequency mixing of RF signals among the plurality of bands which are input to the amplification unit, and causes the respective generated inter-band distortion compensation signal to be carried by each respective RF signal that corresponds to one of the respective pair of bands.

9. A signal transmission method performed by a signal transmission apparatus including an amplification unit that collectively amplifies radio frequency (RF) signals, the method comprising the steps of:

outputting a plurality of analog baseband signals such that each of the plurality of analog baseband signals corresponds to a respective band from among a plurality of bands in a signal generation unit;

converting each of the plurality of output analog baseband signals into a respective radio frequency (RF) signal of the corresponding band in a signal conversion unit;

generating, for each respective band, an in-band distortion compensation signal for compensating for in-band intermodulation distortion occurring due to frequency mixing of RF signals of the respective band, the distortion being included in each respective RF signal which is output from the amplification unit, and causing the respective generated in-band distortion compensation signal to be carried by the RF signals corresponding to the respective band, in an in-band distortion compensation analog circuit unit;

generating, for each respective pair of bands from among the plurality of bands, an inter-band distortion compensation signal for compensating for cross-modulation distortion occurring due to frequency mixing of RF signals among the plurality of bands which are input to the amplification unit, and causing the respective generated inter-band distortion compensation signal to be carried by each respective RF signal that corresponds to one of the respective pair of bands, in an inter-band distortion compensation analog circuit unit; and collectively amplifying and transmitting each respective RF signal, including the corresponding in-band distortion compensation signal and the corresponding inter-band distortion compensation signal, in the amplification unit.

\* \* \* \* \*

UNITED STATES PATENT AND TRADEMARK OFFICE
CERTIFICATE OF CORRECTION

PATENT NO. : 9,596,120 B2
APPLICATION NO. : 15/024891
DATED : March 14, 2017
INVENTOR(S) : Shingo Yamanouchi It is certified that error appears in the above-identified patent and that said Letters Patent is hereby corrected as shown below:

In the Specification

Column 8, Line 41, Expression 7:
"$w_{(1)3}=k_{(1)}r_{(1)3}+m_{(1)3}|p_{(1)}|^2p_{(1)}=0$" should be --$w_{(1)3}=k_{(1)}r_{(1)3}+m_{(1)3}|p_{(2)}|^2p_{(1)}=0$--;

Column 19, Line 33:
"$(g_{RFPD(1)3}, g_{RFPD(2)3},$" should be --$(q_{RFPD(1)3}, q_{RFPD(2)3},$--;

Column 19, Line 44:
After "circuit" insert --80--;

Column 22, Line 38:
After "apparatus" insert --10--;

Column 22, Line 50:
After "apparatus" insert --10--;

Column 23, Line 23:
"$r_{(k)3}|z_1(t)|^2z_k(t)$" should be --$r_{(k)3}|z_j(t)|^2z_k(t)$--;

Column 23, Line 53:
After "apparatus" insert --10--.

Signed and Sealed this
Thirtieth Day of January, 2018

Joseph Matal
*Performing the Functions and Duties of the*
*Under Secretary of Commerce for Intellectual Property and*
*Director of the United States Patent and Trademark Office*